(12) United States Patent
Shinozaki

(10) Patent No.: US 6,707,740 B2
(45) Date of Patent: Mar. 16, 2004

(54) SEMICONDUCTOR MEMORY

(75) Inventor: Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 149 days.

(21) Appl. No.: 10/103,872

(22) Filed: Mar. 25, 2002

(65) Prior Publication Data
US 2003/0026152 A1 Feb. 6, 2003

(30) Foreign Application Priority Data

Aug. 3, 2001 (JP) ........................... 2001-237009

(51) Int. Cl.[7] ................................................ G11C 7/00
(52) U.S. Cl. .................... 365/207; 365/205; 365/196
(58) Field of Search .............................. 365/205, 207, 365/196

(56) References Cited

U.S. PATENT DOCUMENTS

| | | | | |
|---|---|---|---|---|
| 5,668,774 A | * | 9/1997 | Furutani | 365/233 |
| 5,835,443 A | * | 11/1998 | Fujita | 365/233 |
| 5,844,849 A | * | 12/1998 | Furutani | 365/194 |
| 5,883,855 A | * | 3/1999 | Fujita | 365/238.5 |
| 6,151,269 A | * | 11/2000 | Dosaka et al. | 365/233 |
| 6,377,512 B1 | * | 4/2002 | Hamamoto et al. | 365/233 |

FOREIGN PATENT DOCUMENTS

| JP | 409091953 A | * | 4/1997 | ......... G11C/11/401 |
|---|---|---|---|---|
| JP | Hei 11-15361 | | 1/1999 | |

* cited by examiner

*Primary Examiner*—Viet Q. Nguyen
(74) *Attorney, Agent, or Firm*—Arent Fox Kintner Plotkin & Kahn, PLLC

(57) ABSTRACT

A plurality of sense amplifiers amplify parallel read data from memory cells, respectively. At least one of read amplifiers for amplifying the amplified read data respectively has a higher drivability than those of the rest of the read amplifiers. A connection switching circuit connects the sense amplifiers to a predetermined read amplifier according to an address. Switching the read data to one another before the amplification by the read amplifiers allows read data to be first outputted in burst read operation to be amplified by the read amplifier whose drivability is always high. In the burst read operation, a data output circuit first outputs read data corresponding to the read amplifier whose drivability is high. This enables reductions in read operation time and power consumption, even in a semiconductor memory in which the output orders of read data are changeable according to addresses or operation modes.

17 Claims, 20 Drawing Sheets

Fig. 13 sequential mode

| A1,A0 | CDB1 | CDB2 | CDB3 | CDB4 |
|---|---|---|---|---|
| 00 | DB1 | DB2 | DB3 | DB4 |
| 01 | DB2 | DB3 | DB4 | DB1 |
| 10 | DB3 | DB4 | DB1 | DB2 |
| 11 | DB4 | DB1 | DB2 | DB3 | interleave mode

| A1,A0 | CDB1 | CDB2 | CDB3 | CDB4 |
|---|---|---|---|---|
| 00 | DB1 | DB2 | DB3 | DB4 |
| 01 | DB2 | DB1 | DB4 | DB3 |
| 10 | DB3 | DB4 | DB1 | DB2 |
| 11 | DB4 | DB3 | DB2 | DB1 | output order of read data: 1 → 2 → 3 → 4

DB being conected with CDB

SEMICONDUCTOR MEMORY

BACKGROUND OF THE INVENTION

1. Field of the Invention

The present invention relates to a technology for reducing power consumption of a semiconductor memory.

2. Description of the Related Art

FIG. 1 shows an outline of a general SDRAM (Synchronous DRAM) of a conventional art. The SDRAM includes a column decoder CDEC, a memory cell array ALY, a plurality of sense buffers SB, a command decoder CMD, a read control circuit RCNT, a data output circuit OUT and a plurality of input buffers BUF for receiving signals from the exterior. Although not shown in the drawing, the SDRAM includes a control circuit, a row decoder and the like which operate according to a row address.

The column decoder CDEC activates a column line selecting signal CL1 (or CL2 to CL4) according to a column address of an address signal ADD supplied from the exterior. The memory cell array ALY includes a plurality of memory cells MC and a plurality of sense amplifiers SA and column switches CSW which correspond to the memory cells MC. In the memory cell array ALY, read data DT which are read from the plurality of memory cells MC in parallel during read operation are respectively amplified in the sense amplifiers SA to become small-amplitude data signal. Thereafter, for example, the column line selecting signal CL1 is activated, the corresponding column switch CSW turns on, and the data DT of the memory cell MC corresponding to the column line selecting signal CL1 is transmitted to a local data bus line DB.

The command decoder CMD decodes a command signal CNT supplied from the exterior, and outputs a decoding result to the read control circuit RCNT. When the decoding result indicates a read command, the read control circuit RCNT activates a read control signal RDZ in synchronization with a clock signal CLK. Further, the read control circuit RCNT generates a control signal for operating the above-described column decoder CDEC. The sense buffers SB are activated in response to the read control signal RDZ. The sense buffers SB amplify the read data DT on the local data bus line DB up to a CMOS level, and output the amplified data to a common data bus line CDB. Namely, the sense buffers SB operate as read amplifiers for amplifying the read data DT further which are already amplified in the sense amplifiers SA.

The data output circuit OUT receives the read data DT through the common data bus line CDB, and outputs the received read data DT to the exterior in synchronization with an internal clock signal CLKZ which synchronizes with the clock signal CLK supplied from the exterior.

FIG. 2 shows burst read operation of the above-described SDRAM. In this example, a word line is already activated according to a row address signal in the first state of the timing chart, and data DT1 to DT4 which are read from the plurality of memory cells MC are respectively amplified by the sense amplifiers SA. A burst length is set to "4". It should be mentioned that the burst length is a number of times of successively outputting the read data in one read operation. As will be described later, the read control circuit RCNT activates the read control signal RDZ the number of times corresponding to the burst length, and the sense buffers SB operate the number of times corresponding to the burst length so that the read data DT are sequentially outputted to the common data bus line CDB.

First, a read command RD and a column address (not shown) are supplied in synchronization with the zeroth clock signal CLK (FIG. 2(a)). The read control circuit RCNT in FIG. 1 controls the column decoder CDEC, and activates the column line selecting signal CL1 which corresponds to the column address (FIG. 2(b)). In response to the activation of the column line selecting signal CL1, the column switch CSW turns on, and the read data DT1 is transmitted to the local data bus line DB (FIG. 2(c)).

The read control circuit RCNT activates the read control signal RDZ in synchronization with the clock signal CLK to operate the sense buffers SB (FIG. 2(d)). The sense buffers SB amplify the read data DT1 on the local data bus line DB up to the CMOS level, and output the amplified data to the common data bus line CDB (FIG. 2(e)). Since it is required for the sense buffers SB to drive the common data bus line CDB whose wiring length is large, it is necessary to speed up these operations and to increase these drivabilities. The data output circuit OUT outputs the read data DT received through the common data bus line CDB to the exterior in synchronization with the internal clock signal CLKZ (FIG. 2(f)).

Thereafter, operations similar to the above are performed in the first to third clock cycles, and the read data DT2 to DT4 are sequentially outputted to the exterior. Namely, the read control signal RDZ is activated a number of times corresponding to the burst length, and the sense buffers SB perform amplifying operations this number of times.

As described above, each of the sense buffers SB is structured by a circuit operating at a high speed in order to amplify the small-amplitude data signal of the read data DT up to the CMOS level at a high speed. Further, since it is necessary for the sense buffers SB to output the amplified data to the common data bus line CDB having a large load, the sense buffers SB are designed so that these drivabilities are high enough. Hence, the sense buffers SB consume large current. Further, the same number of the sense buffers SB as a bit number of data terminals concurrently operate. Hence, power consumption of the SDRAM during the read operation is highly dependent on the power consumption of the sense buffers SB.

During the burst read operation, the sense buffers SB and their control circuit operate the number of times corresponding to the burst length. Hence, the power consumption increases further.

In general, measures have been taken so that the read data DT are transmitted to the data output circuit OUT at a high speed, such as increasing a wiring width of the common data bus line CDB, reducing its resistance, and the like. Alternatively, a buffer with a high drivability is inserted at the midpoint of the common data bus line CDB, thereby reducing a transfer time of the read data DT. However, these measures cause further increase in the power consumption.

SUMMARY OF THE INVENTION

It is an object of the present invention to provide a semiconductor memory which can substantially reduce its power consumption during read operation as compared with a conventional art, and, more particularly, to reduce power consumption during burst read operation.

According to one of the aspects of the semiconductor memory of the present invention, a plurality of sense amplifiers amplify parallel read data from a plurality of memory cells, respectively.

A connection switching circuit connects the sense amplifiers to a predetermined read amplifier, according to an address. Switching the read data to one another before amplification by the read amplifiers allows read data to be first outputted during the burst read operation to be amplified by the read amplifier always having a higher drivability. Therefore, it is possible to shorten a read operation time and to reduce the power consumption, even in the semiconductor memory in which the output orders of read data are switchable according to addresses or operation modes.

A plurality of the read amplifiers amplify the read data amplified in the sense amplifiers up to predetermined logic levels, respectively. At least one of the read amplifiers has a higher drivability than those of the rest of the read amplifiers. The read amplifier having a higher drivability can drive the data bus lines at a higher speed than the rest of the read amplifiers. The read data amplified by the read amplifier having a higher drivability is transmitted to a data output circuit before the other read data, and hence it is possible to shorten the data read time. The drivability of the read amplifiers are easily adjusted by, for example, sizes, such as a gate width, of transistors constituting the read amplifiers.

The data output circuit outputs read data corresponding to the read amplifier having a higher drivability first, during burst read operation in which parallel read data from the memory cells are outputted to the exterior in serial. In the burst read operation, therefore, a time taken for outputting the first read data can be shortened.

Meanwhile, the data output circuit has a considerable time margin for outputting the second and subsequent read data. For example, at the case of a- semiconductor memory of clock synchronous type, it has a margin of at least one clock cycle. Hence, the read amplifiers for amplifying the second and subsequent read data can perform the read operation properly, even when their drivabilities are low. The drivabilities of some of the read amplifiers can be lowered, thereby reducing the power consumption during the burst read operation. The data output circuit comprises, for example, a parallel/serial conversion circuit for outputting parallel read data outputted from the read amplifiers as serial data.

According to another aspect of the semiconductor memory of the present invention, column switches connect the sense amplifiers and the read amplifiers, respectively. The column switches turn on in the first clock cycle of the burst read operation, and transmit read data to the read amplifiers simultaneously. Tuning on a plurality of column switches at the same time realizes simple configuration of a circuit for controlling the column switches.

According to another aspect of the semiconductor memory of the present invention, The data bus lines have first data bus line(s) connected to the read amplifier(s) having higher drivability(s) and second data bus lines connected to the rest of the read amplifiers. Impedance(s) of the first data bus line(s) is/are lower than impedances of the second read amplifiers. This further quickens transmission of read data to be outputted first to the data output circuit. The impedances of the data bus lines can be easily adjusted according to wiring widths of the data bus lines, material of wires, and types of wiring layers on which the data bus lines are formed.

According to another aspect of the semiconductor memory of the present invention, a read control circuit generates a plurality of read control signals for activating the read amplifiers respectively. The read control circuit outputs a read control signal corresponding to the read amplifier having a higher drivability, before read control signals corresponding to the rest of the read amplifiers. Shifting operation timings of the read amplifiers from one another can reduce a peak current during the burst read operation. In this case, the read data output time does not delay unless activation timing of a read control signal for amplifying read data to be first outputted changes.

According to another aspect of the semiconductor memory of the present invention, the read amplifier having a higher drivability operates to output data, when a burst length, as a number of times of successively outputting read data, is set to a singular number, that is, when normal read operation is performed instead of the burst read operation. Thus, it is also possible to perform the normal read operation at high speed.

According to another aspect of the semiconductor memory of the present invention, a plurality of blocks having the memory cells, the sense amplifiers, the read amplifiers, the data output circuit, and the data bus lines are formed corresponding to a plurality of data terminals, respectively. This makes it possible to shorten the read operation time and to reduce the power consumption, even in a so-called multi-bit semiconductor memory.

According to another aspect of the semiconductor memory of the present invention, the blocks are arranged in a first direction, and the data bus lines are wired in a second direction orthogonal to the first direction. Since the data bus lines are always wired in the same direction, it is possible to shorten wiring lengths of the data bus lines, and to minimize wiring resistances and wiring capacitances of the data bus lines. This can further shorten the read operation time and reduce the power consumption.

According to another aspect of the semiconductor memory of the present invention, the blocks are arranged in a disposing direction of the data terminals. Hence, the blocks can be arranged adjacent to their corresponding data terminals, respectively, which can further shorten the wiring lengths of the data bus lines.

According to another aspect of the semiconductor memory of the present invention, each of the blocks is divided into a plurality of memory areas in the second direction. A plurality of the memory areas aligned in the first direction form a plurality of banks which can operate independently. Namely, when the data bus lines are wired in the same direction, the banks are arranged in a disposing direction of the data bus lines (second direction) so that read data from the memory cells can be transmitted only in the second direction. As a result of this, it is possible to minimize lengths of signal lines such as the data bus lines for transmitting read data, and to further shorten the read operation time.

According to another aspect of the semiconductor memory of the present invention, a switching circuit sequentially outputs the parallel read data amplified in the read amplifiers as serial data during burst read operation. Arranging the switching circuit close to the read amplifiers achieves a reduction in the number of the data bus lines.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 13 is an explanatory view showing a correspondence between addresses and output orders of read data;

DESCRIPTION OF THE PREFERRED EMBODIMENTS

Hereinafter, preferred embodiments of the present invention will be explained with reference to the drawings.

Figure 3:
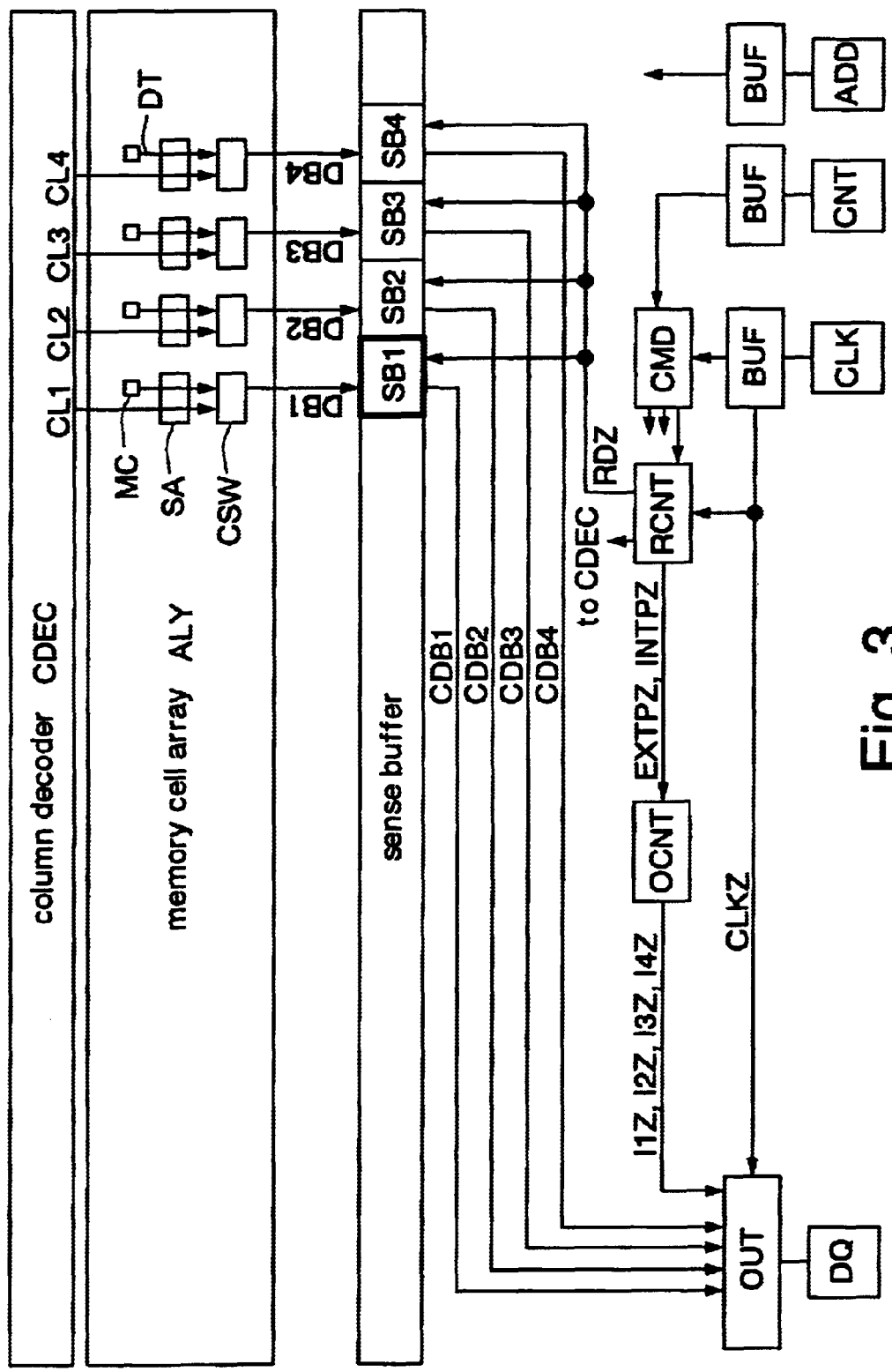
FIG. 3 is a block diagram showing a first embodiment.

FIG. 3 shows a first embodiment of the semiconductor memory according to the present invention. Detailed explanations about circuits and signals which are the same as those in Description of the Related Art will be omitted. This semiconductor memory is formed on a silicon substrate as an SDRAM by using a CMOS process.

Figure 1:
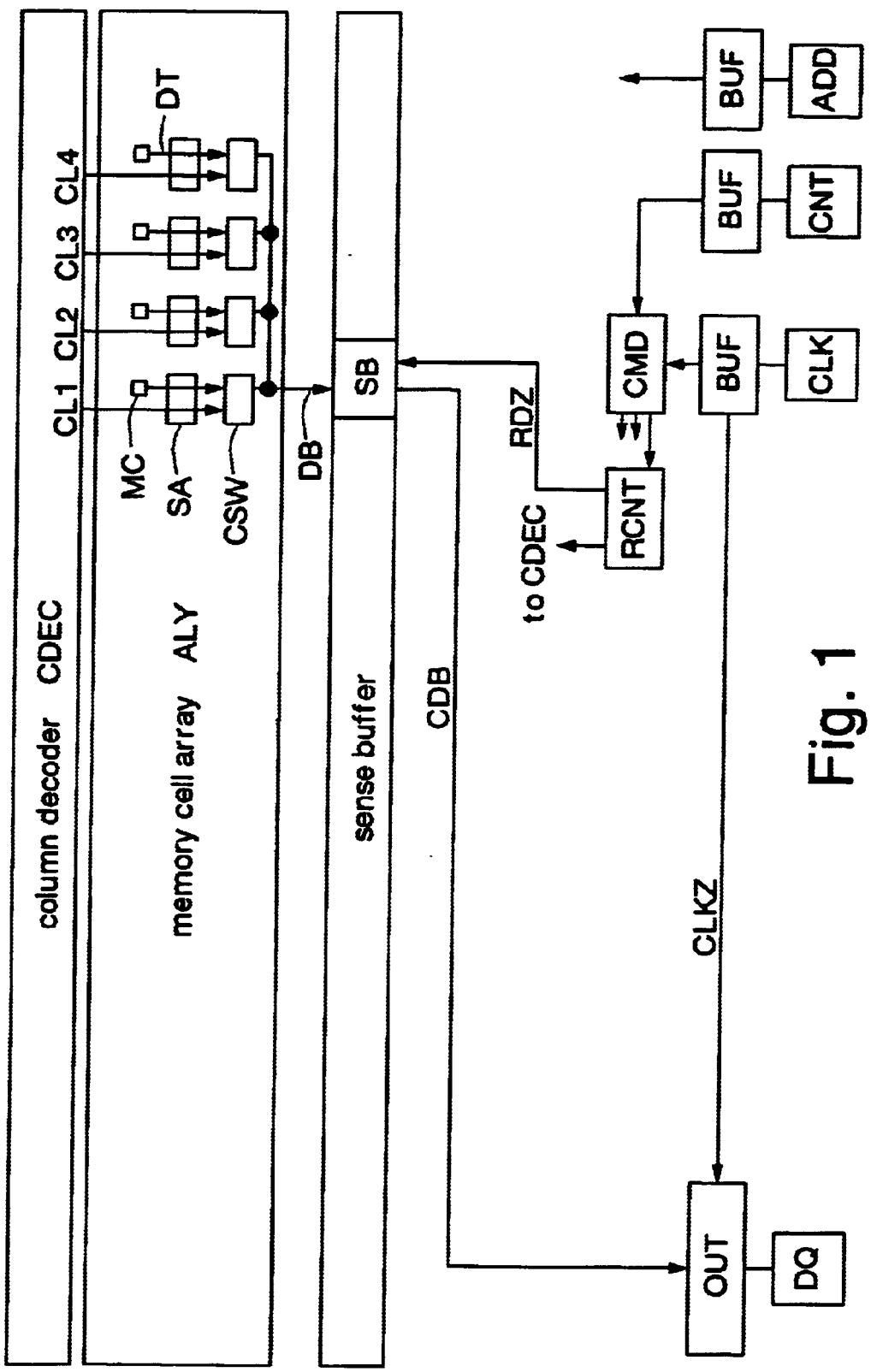
FIG. 1 is a block diagram showing an outline of a conventional SDRAM.
Figure 2:
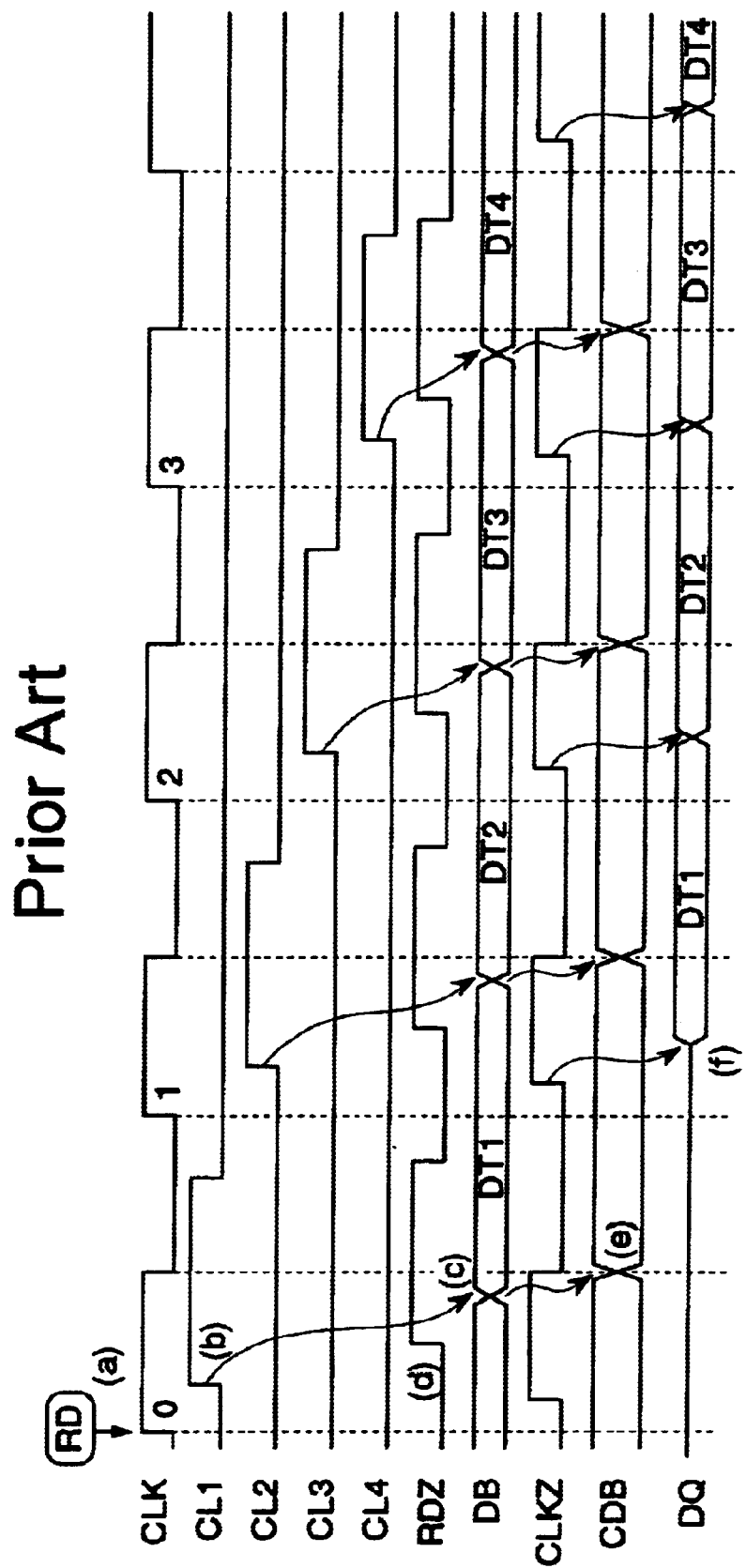
FIG. 2 is a timing chart showing conventional read operation.

The SDRAM includes a column decoder CDEC, a memory cell array ALY, four sense buffers (read amplifiers) SB1 to SB4, a command decoder CMD, a read control circuit RCNT, a data output circuit OUT, an output control circuit OCNT, and a plurality of input buffers BUF for receiving signals from the exterior. Basic structures of the column decoder CDEC, the memory cell array ALY and the command decoder CMD are the same as those shown in FIG. 1. Although not shown in the drawing, the SDRAM includes a control circuit, a row decoder and the like which operate according to a row address. In this example, the structure corresponding to one data terminal DQ is explained, but a number of paths which are actually formed for transmitting read data DT corresponds to a number of bits of the data terminals.

According to this embodiment, the column decoder CDEC simultaneously activates column line selecting signals CL1 to CL4 which correspond to read data DT to be outputted to the exterior, in burst read operation. Namely, a plurality of column switches CSW which correspond to a burst length turn on simultaneously. Hence, local data bus lines DB1 to DB4 are formed corresponding to the respective column switches CSW. The local data bus lines DB1 to DB4 are respectively connected to the sense buffers SB1 to SB4.

The sense buffers SB1 to SB4 are respectively connected to common data bus lines CDB1 to CDB4. Namely, transmission paths of the read data DT, which are read from memory cells MC, to the data output circuit OUT are independent of one another.

As indicated by a bold frame in the drawing, the sense buffer SB1 which is connected to the local data bus line DB1 has a faster operation speed and a higher drivability, as compared with the other sense buffers SB2 to SB4. Moreover, the common data bus line CDB1 which is connected to the sense buffer SB1 has a larger wiring width as compared with the other common data bus lines CDB2 to CDB4, and its wiring resistance is low. For this reason, the read data DT which is amplified in the sense buffer SB1 is transmitted to the data output circuit OUT in a short time. Incidentally, an increase in a wiring capacitance due to the large wiring width is only a slight amount (when the width is twice, the increase in the wiring capacitance is approximately 1.1 times).

The read control circuit RCNT outputs a read control signal RDZ to the sense buffers SB1 to SB4 and outputs timing signals EXTPZ and INTPZ to the output control circuit OCNT, when a decoding result indicates a read command. In synchronization with the timing signals EXTPZ and INTPZ, the output control circuit OCNT outputs output timing signals 11Z to 14Z to the data output circuit OUT.

Figure 4:
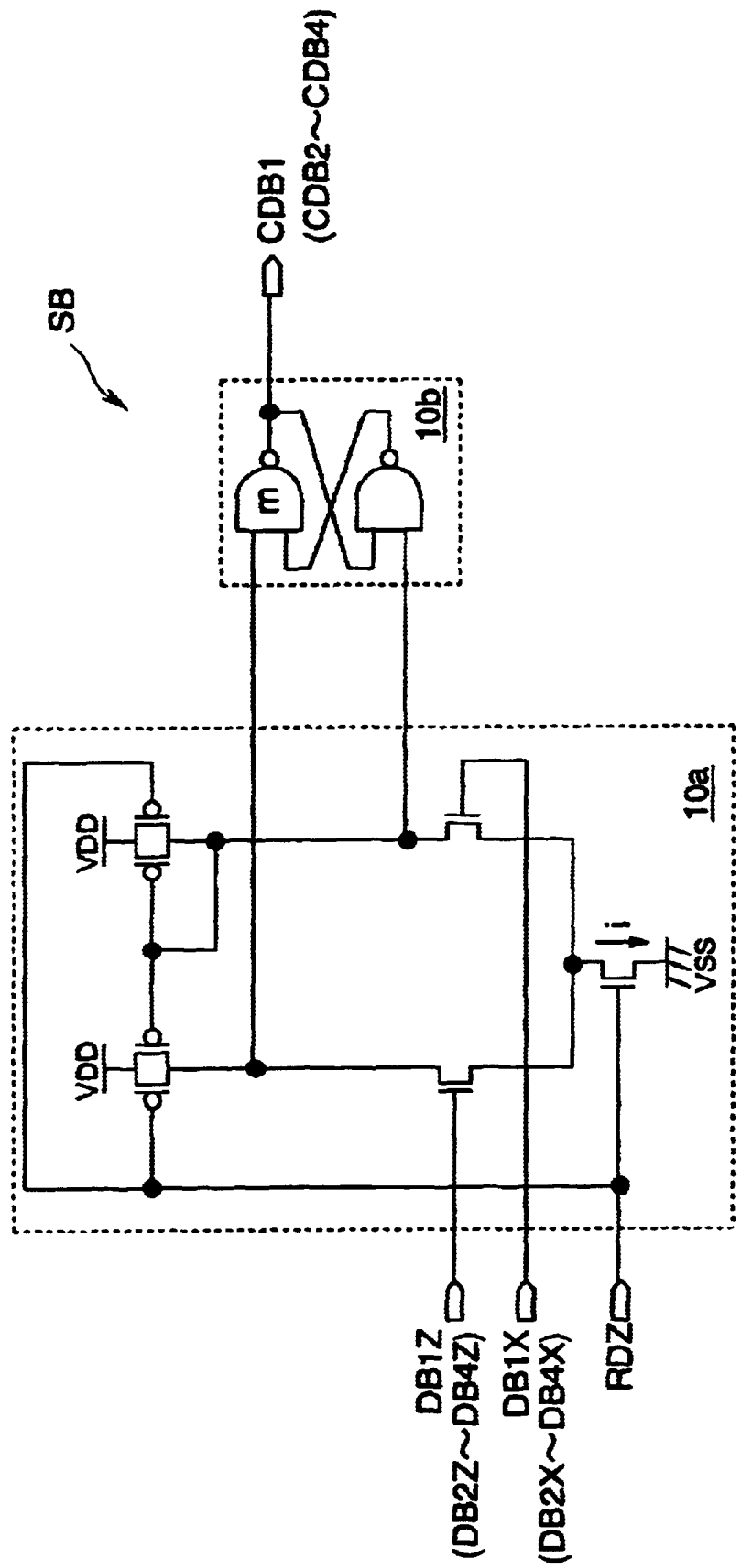
FIG. 4 is a circuit diagram showing the details of a sense buffer in FIG. 3.

FIG. 4 shows the details of each of the sense buffers SB1 to SB4 in FIG. 3. Each of the sense buffers SB1 to SB4 includes a differential amplifier 10a and an output latch 10b. The differential amplifier 10a includes two differential input parts each of which consists of an nMOS transistor, current mirror parts which supply current to the differential input parts, and an nMOS transistor which connects sources of the differential input parts to a ground line VSS. The differential amplifier 10a is activated when the read control signal RDZ is activated (high level). The output latch 10b consists of an RS flip-flop.

The differential amplifier 10a receives read data of a positive logic DB1Z (or DB2Z to DB4Z) and read data of a negative logic DB1X (or DB2X to DB4X) at the respective differential input parts, to perform amplifying operation. An amplifying result is latched by the output latch 10b, and outputted to the common data bus line CDB1 (or CDB2 to CDB4). It should be mentioned that the last alphabets "Z" and "X" of the signals mean the positive logic and the negative logic, respectively.

As to the nMOS transistor of the differential amplifier 10a, which is connected to the ground line VSS, a symbol "i" means a current consumed during operation of the differential amplifier 10a. As to the output latch 10b, a symbol "m" means a transistor size of a NAND gate. To be precise, the symbol "m" means a ratio W/L between a gate width W and a channel length L of a transistor which constitutes the NAND gate, and means current consumption (=drivability) of the output latch 10b. According to this embodiment, "i" and "m" of the sense buffer SB1 which corresponds to the common data bus line CDB1 are designed so as to triple "i" and "m" of the sense buffers SB2 to SB4 which correspond to the other common data bus lines CDB2 to CDB4. In other words, "i" and "m" of the sense buffers SB2 to SB4 which are connected to the common data bus lines CDB2 to CDB4 are one-third of those of the conventional art.

Hence, when the current consumption of the differential amplifier 10a which is connected to the common data bus line CDB1 (first data bus line) is "I" and the current consumption of each of the differential amplifiers 10a which are connected to the common data bus lines CDB2 to CDB4 (second data bus lines) is "⅓·I", current consumption of the four differential amplifiers 10a as a whole becomes "2I". In the conventional art, the current consumption of the four differential amplifiers 10a as a whole is "4I", which means that the current consumption is reduced to half.

Similarly, when the current consumption of the output latch 10b which is connected to the common data bus line CDB1 is "M" and the current consumption of the output latches 10b which are connected to the common data bus lines CDB2 to CDB4 is "⅓·M", current consumption of the four output latches 10b as a whole becomes "2M". In the conventional art, the current consumption of the four output latches 10b as a whole is "4M", which means that the current consumption is reduced to half.

Therefore, current consumption of the sense buffers SB1 to SB4 as a whole can be reduced to half as compared with the conventional art. When, for example, "I" and "M" are 0.3 mA and 0.2 mA, respectively, the current consumption of the sense buffers SB1 to SB4 becomes 1 mA ([0.3 mA+⅓·0.3 mA×3]+[0.2 mA+⅓·0.2 mA×3]), which is a half of the conventional current consumption 2 mA (0.3 mA×4+ 0.2 mA×4). A reduced amount of the current consumption of the sense buffers SB1 to SB4, as compared with the conventional art, becomes 8 mA (1 mA×8) in an SDRAM whose number of the data terminals is 8, and becomes 16 mA (1 mA×16) in an SDRAM whose number of the data terminals is 16. Thus, according to the present invention, a reduction effect of the current consumption increases as the number of the data terminals increases.

Figure 5:
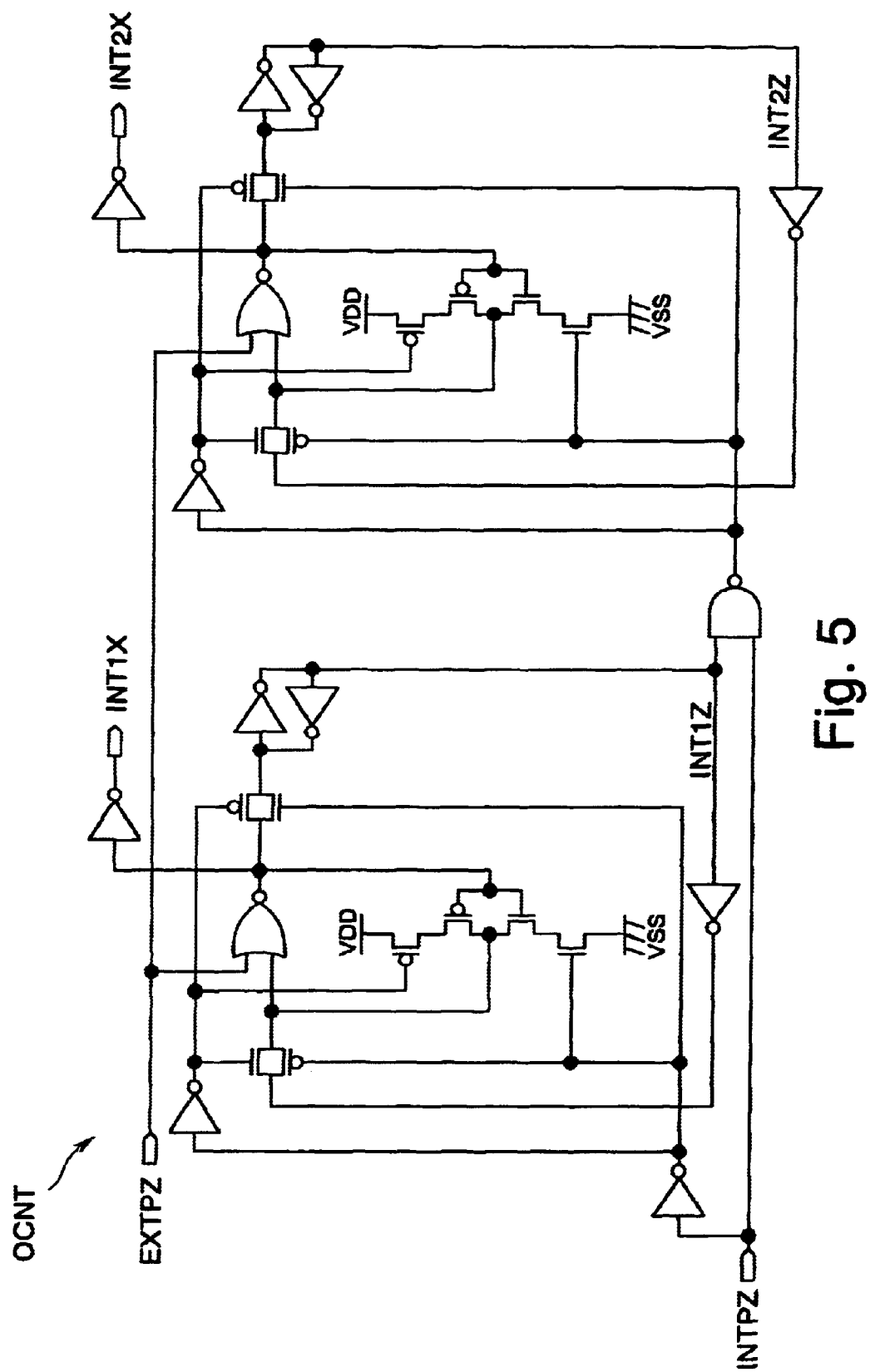
FIG. 5 is a circuit diagram showing the details of an output control circuit in FIG. 3.
Figure 6:
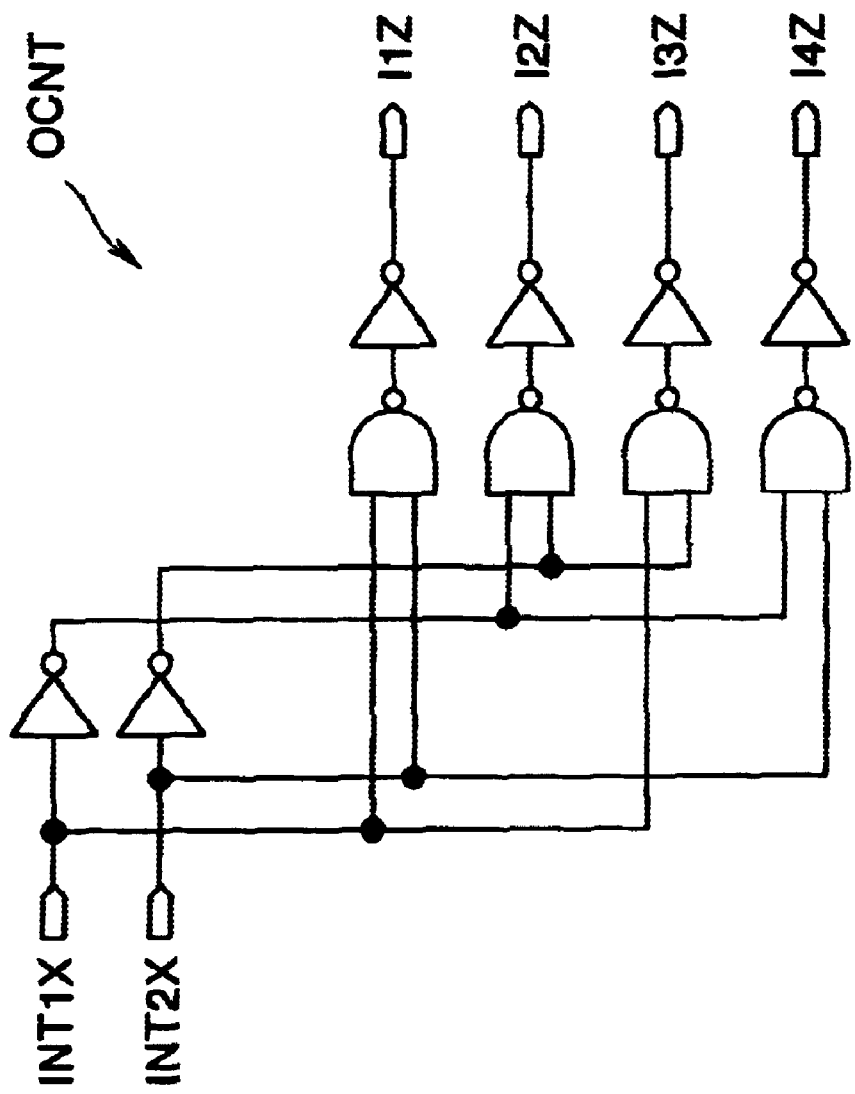
FIG. 6 is a circuit diagram showing the details of the output control circuit in FIG. 3.

FIG. 5 and FIG. 6 show the details of the output control circuit OCNT. The structures of FIG. 5 and FIG. 6 are combined together to show the structure of the output control circuit OCNT. FIG. 5 shows a two-bit binary counter in the output control circuit OCNT. This binary counter is the circuit which has been used conventionally, such as a refresh address counter. This kind of counter performs count operation in synchronization with a clock signal (count cycle is low), and hence its transistor size is small and power consumption is low. Therefore, it is unlikely that the arrangement of the binary counter causes a layout size to increase substantially and the power consumption to increase substantially.

In FIG. 5, counters in a preceding stage and a subsequent stage are reset by a high-level pulse of the timing signal EXTPZ. The counter in the preceding stage inverts the level of a counter signal INT1X in synchronization with a rising edge of the timing signal INTPZ. The counter in the subsequent stage inverts the level of a counter signal INT2X in synchronization with a falling edge of the counter signal INT1X.

FIG. 6 shows a logic circuit which generates the output timing signals I1Z to I4Z by using the counter signals INT1X and INT2X outputted from the binary counter. In this logic circuit, any of the output timing signals I1Z to I4Z turns into a high level according to the levels of the counter signals INT1X and INT2X.

Figure 7:
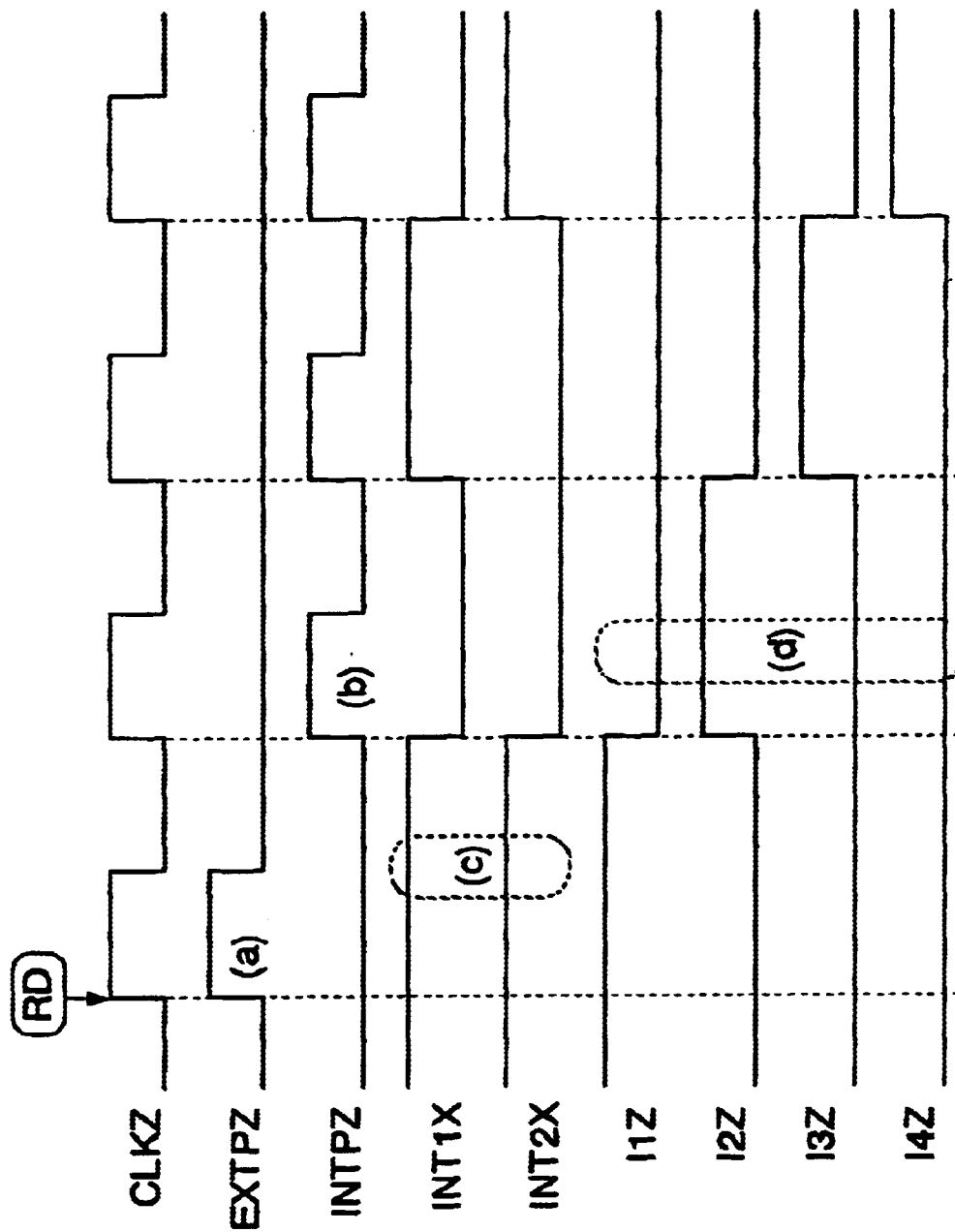
FIG. 7 is a timing chart showing the operation of the output control circuit in FIG. 3.

FIG. 7 shows the operation of the output control circuit OCNT. The output control circuit OCNT activates the timing signal EXTPZ for a period of half a clock, in synchronization with a clock signal CLK with which a read command RD is supplied (FIG. 7(a)). Further, the output control circuit OCNT sequentially activates the timing signal INTPZ for periods of half a clock, in synchronization with the next clock signal CLK (FIG. 7(b)). The timing signal INTPZ is activated a number of times which is less than the burst length by one. The binary counter in FIG. 5 operates in synchronization with the timing signals EXTPZ and INTPZ, and outputs the counter signals INT1X and INT2X (FIG. 7(c)). The logic circuit in FIG. 6 receives the counter signals INT1X and INT2X, and sequentially turns the output timing signals I1Z to I4Z into the high levels, in synchronization with rising edges of the clock signal CLK (FIG. 7(d)).

Figure 8:
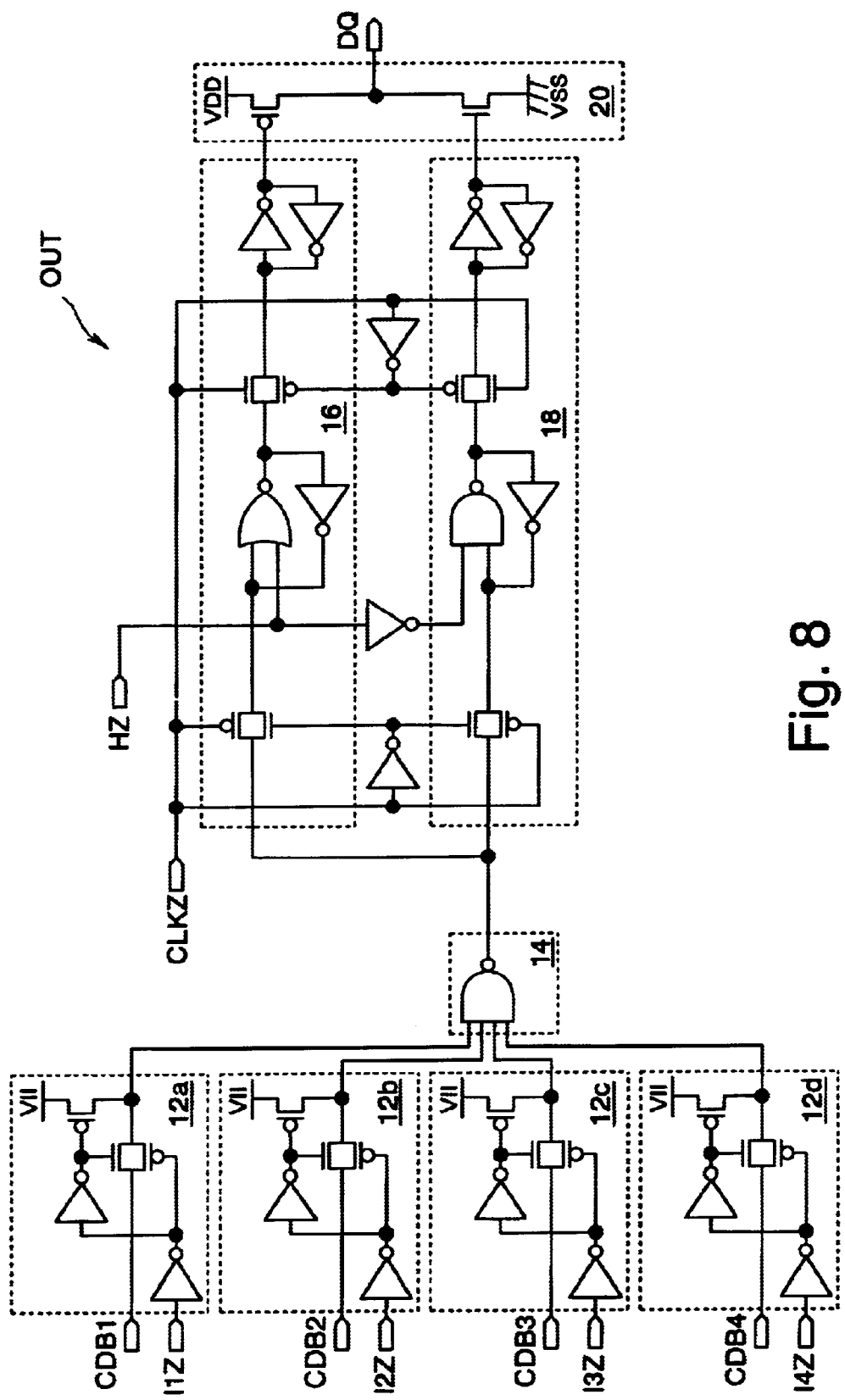
FIG. 8 is a circuit diagram showing the details of a data output circuit in FIG. 3.

FIG. 8 shows the details of the data output circuit OUT. According to the present invention, read data DT1 to DT4, whose number corresponds to the burst length "4", are transferred in parallel to the data output circuit OUT. Hence, it is necessary to convert the read data DT1 to DT4 from parallel to serial in the data output circuit OUT. The data output circuit OUT includes switching circuits 12a, 12b, 12c and 12d, a NAND gate 14, output latching circuits 16 and 18, and a tri-state output buffer 20. When the respective output timing signals I1Z to I4Z are at the high levels, the switching circuits 12a to 12d transmit the read data which are supplied to the common data bus lines CDB1 to CDB4 to the NAND gate 14. Further, when the respective output timing signals I1Z to I4Z are at the low level, the switching circuits 12a to 12d transmit the high levels to the NAND gate 14.

As shown in FIG. 7, only one of the output timing signals I1Z to I4Z changes to the high level during one clock cycle. Hence, three inputs of the four-input NAND gate 14 become the high levels without fail. Therefore, in outputting the read data, the NAND gate 14 operates as an inverter which inverts the read data supplied to the common data bus lines CDB1 to CDB4.

The output latching circuits 16 and 18 are the circuits for respectively controlling a pMOS transistor and an nMOS transistor in the output buffer 20. The output latching circuits 16 and 18 accept inverting data of the read data outputted from the NAND gate 14 into their interior when an internal clock signal CLKZ is at the low level, invert the accepted data, and output it to the output buffer 20 when the internal clock signal CLKZ is at the high level. The output latching circuits 16 and 18 reset their internal latches when an output disable signal HZ is at the high level, and output the high level and the low level, respectively. Namely, an output of the output buffer 20 (data terminal DQ) becomes a high impedance when the output disable signal HZ is at the high level.

Figure 9:
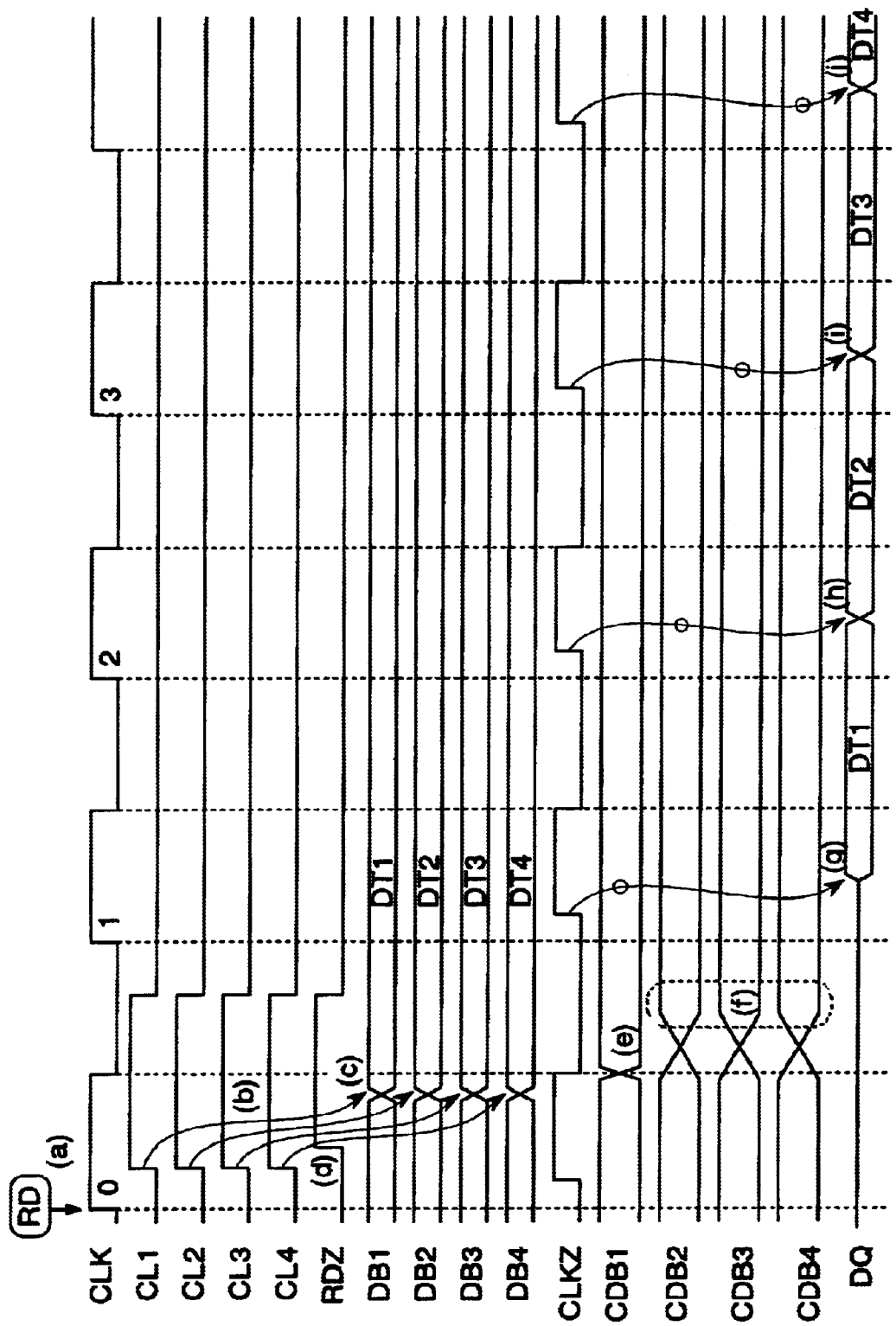
FIG. 9 is a timing chart showing burst read operation of the first embodiment.

FIG. 9 shows the burst read operation of the above-described SDRAM. In this example, a word line is already activated according to a row address signal in the first state of the timing chart, and the data DT1 to DT4 which are read from the plurality of memory cells MC are respectively amplified by sense amplifiers SA. The burst length is set to "4". Further, read latency is set to "2". It should be mentioned that the read latency is a number of the clocks from reception of the read command RD until an output of the first read data. According to this embodiment, the read control circuit RCNT activates the read control signal RDZ only during the first clock cycle, irrespective of the burst length, and the sense buffers SB1 to SB4 operate only during the first clock cycle.

First, the read command RD and a column address (not shown) are supplied in synchronization with the zeroth clock signal CLK (FIG. 9(a)). The read control circuit RCNT in FIG. 3 controls the column decoder CDEC, and activates all of the column line selecting signals CL1 to CL4 which are necessary for the burst read operation, during the first clock cycle (FIG. 9(b)). In response to the activation of the column line selecting signals CL1 to CL4, the four column switches CSW simultaneously turn on, and the read data DT1 to DT4 are respectively transmitted to the local data bus lines DB1 to DB4 (FIG. 9(c)).

The read control circuit RCNT activates the read control signal RDZ in synchronization with the clock signal CLK (FIG. 9(d)). In response to the activation of the read control signal RDZ, the sense buffers SB1 to SB4 in FIG. 3 start operations at the same time. The sense buffers SB1 to SB4 amplify the read data DT1 to DT4 on the local data bus lines DB1 to DB4 up to CMOS levels, respectively, and output the amplified data to the common data bus lines CDB1 to CDB4.

According to this embodiment, the read control signal RDZ is activated only once during one burst read operation. Hence, when the burst length is "4", numbers of operations of the control circuits (for example, the read control circuit RCNT), which relate to the read control signal RDZ, are quartered as compared with the conventional art. As a result of this, the power consumption of the control circuits are quartered as compared with the conventional art.

As explained with reference to FIG. 4, the sense buffer SB1 which is connected to the common data bus line CDB1 has the higher drivability than those of the other sense buffers SB2 to SB4. Hence, the common data bus line CDB1 changes more quickly than the other common data bus lines CDB2 to CDB4 (FIG. 9(e)). Namely, the read data DT1 is transmitted at a high speed to the data output circuit OUT. The common data bus lines CDB2 to CDB4 transmit the read data DT2 to DT4 at a low speed (FIG. 9(f)). Since the read data DT2 to DT4 are outputted in the second and subsequent clock cycles, the low transmission speed does not cause a problem. Next, the data output circuit OUT outputs the read data DT1, which is received through the common data bus line CDB1, to the exterior in synchronization with the internal clock signal CLKZ (FIG. 9(g)). A controller (not shown) of a system on which the SDRAM is mounted accepts the read data DT1 in synchronization with the rising edge of the second clock signal (read latency= "2").

Thereafter, the data output circuit OUT sequentially outputs the read data DT2 to DT4 on the common data bus lines CDB2 to CDB4 to the exterior, in synchronization with the first to third internal clock signal CLKZ (FIGS. 9(h), (i) and (j)).

As described above, according to this embodiment, the drivability of the sense buffer SB1 is made to be higher than the drivabilities of the other sense buffers SB2 to SB4. The data output circuit OUT outputs the read data DT1 first, which is amplified by the sense buffer SB1. Therefore, it is possible to shorten a time taken for outputting the first read data, in the burst read operation.

Since the drivabilities of the sense buffers SB2 to SB4 are made to be low, it is possible to reduce the power consumption during the burst read operation. There is a margin of one clock cycle until the data output circuit outputs the second and subsequent read data. Hence, the read data DT2 to DT4 can be outputted correctly in synchronization with the second and subsequent clock cycles, even though the drivabilities of the sense buffers SB2 to SB4 are low.

The column switches CSW are turned on in synchronization with the first clock cycle, in the burst read operation.

Since the plurality of column switches CSW can be turned on at the same time, it is possible to simply structure the circuit for controlling the column switches CSW.

The impedance of the common data bus line CDB1 which is connected to the sense buffer SB1 with high drivability is made to be lower than those of the other common data bus lines CDB2 to CDB4. Hence, the read data DT1 which is outputted first can be transmitted to the data output circuit OUT at a higher speed.

Figure 10:
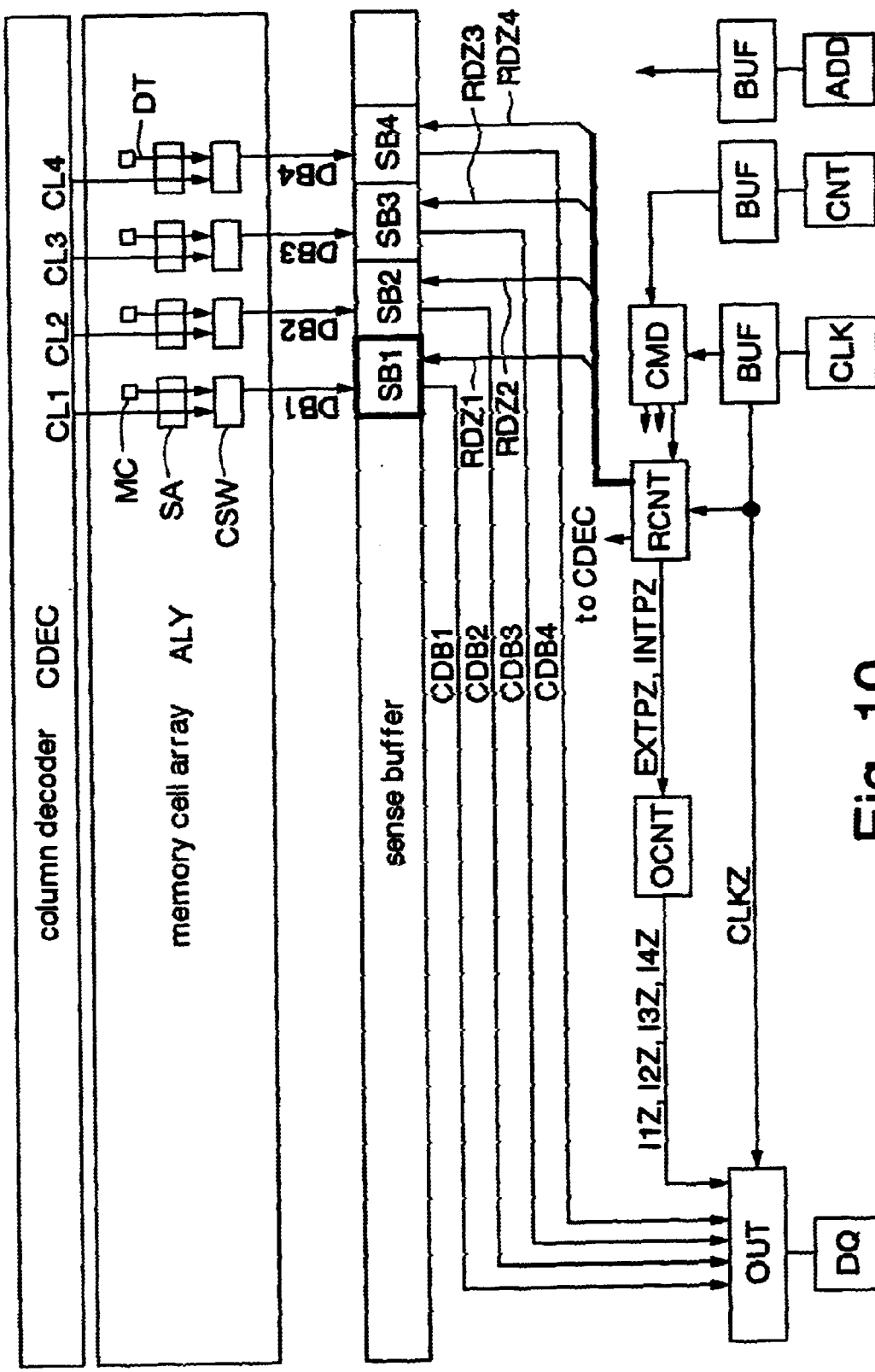
FIG. 10 is a block diagram showing a second embodiment.

FIG. 10 shows a second embodiment of the semiconductor memory according to the present invention. The same numerals and symbols are given to designate the same circuits and signals as those explained in the first embodiment, and detailed explanations thereof will be omitted.

According to this embodiment, a read control circuit RCNT outputs read control signals RDZ1 to RDZ4 which correspond to sense buffers SB1 to SB4, respectively. Activation timings of the read control signals RDZ1 to RDZ4 are sequentially shifted from one another. The rest of the structure is the same as that of the first embodiment.

Figure 11:
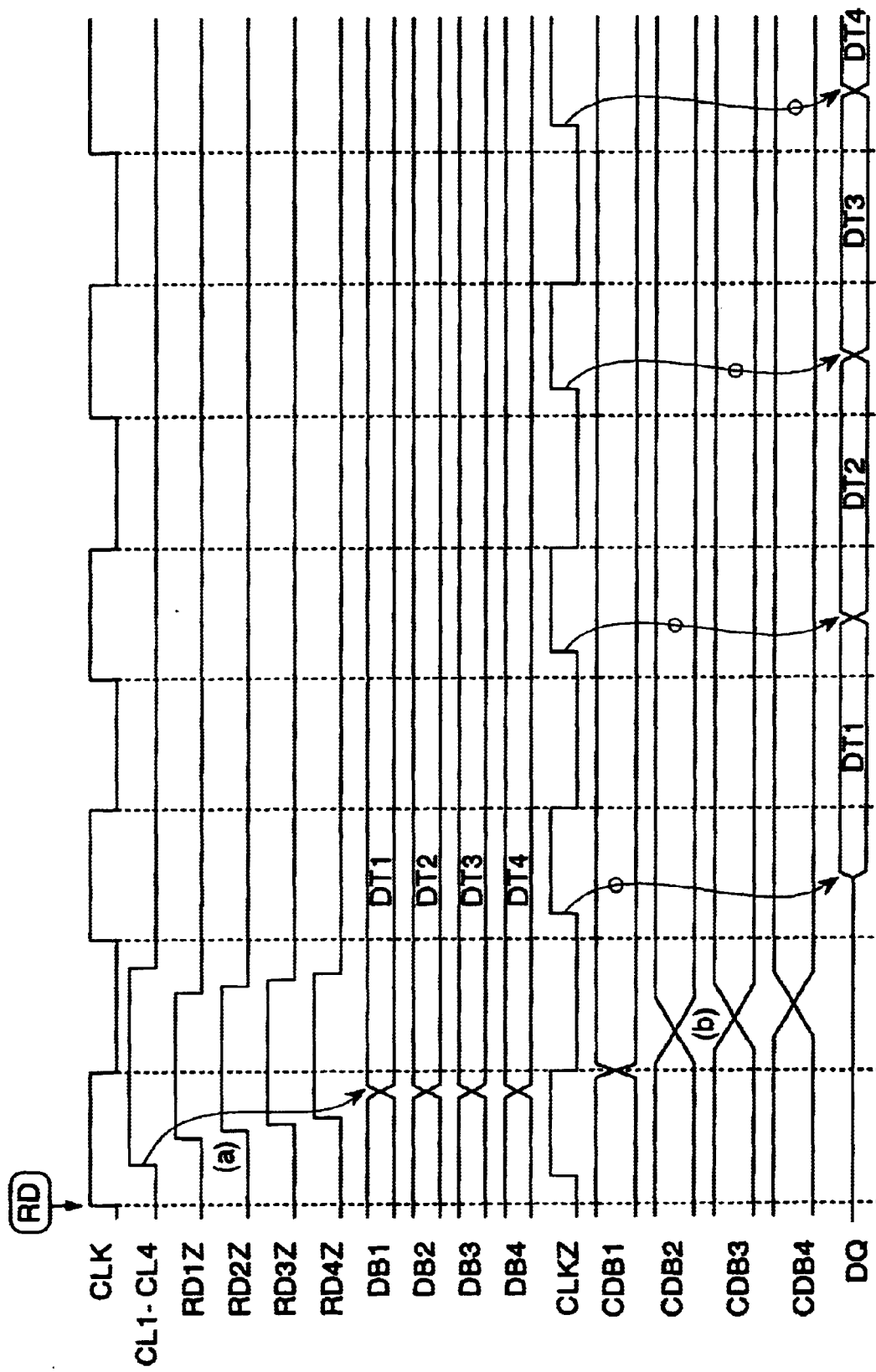
FIG. 11 is a timing chart showing burst read operation of the second embodiment.

FIG. 11 shows burst read operation of the SDRAM according to the second embodiment. In this example, the read control signals RDZ1 to RDZ4 are sequentially activated (FIG. 11(a)), and hence the sense buffers SB1 to SB4 start to operate while being delayed gradually. Therefore, current consumption of the sense buffers SB1 to SB4 can be dispersed. Namely, a peak current during the read operation can be reduced.

Read data DT2 to DT4 are transmitted to common data bus lines CDB2 to CDB4 slower than those of the first embodiment (FIG. 11(b)). However, since the read data DT2 to DT4 are outputted in the second and subsequent clock cycles, the low transmission speed does not cause a problem.

The same effects as those of the above-described first embodiment can be obtained in this embodiment as well. Further, according to this embodiment, it is possible to reduce the peak current during the burst read operation. In this case, output timings of the read data are not delayed unless the activation timing of the read control signal for amplifying the read data to be outputted first is changed.

Figure 12:
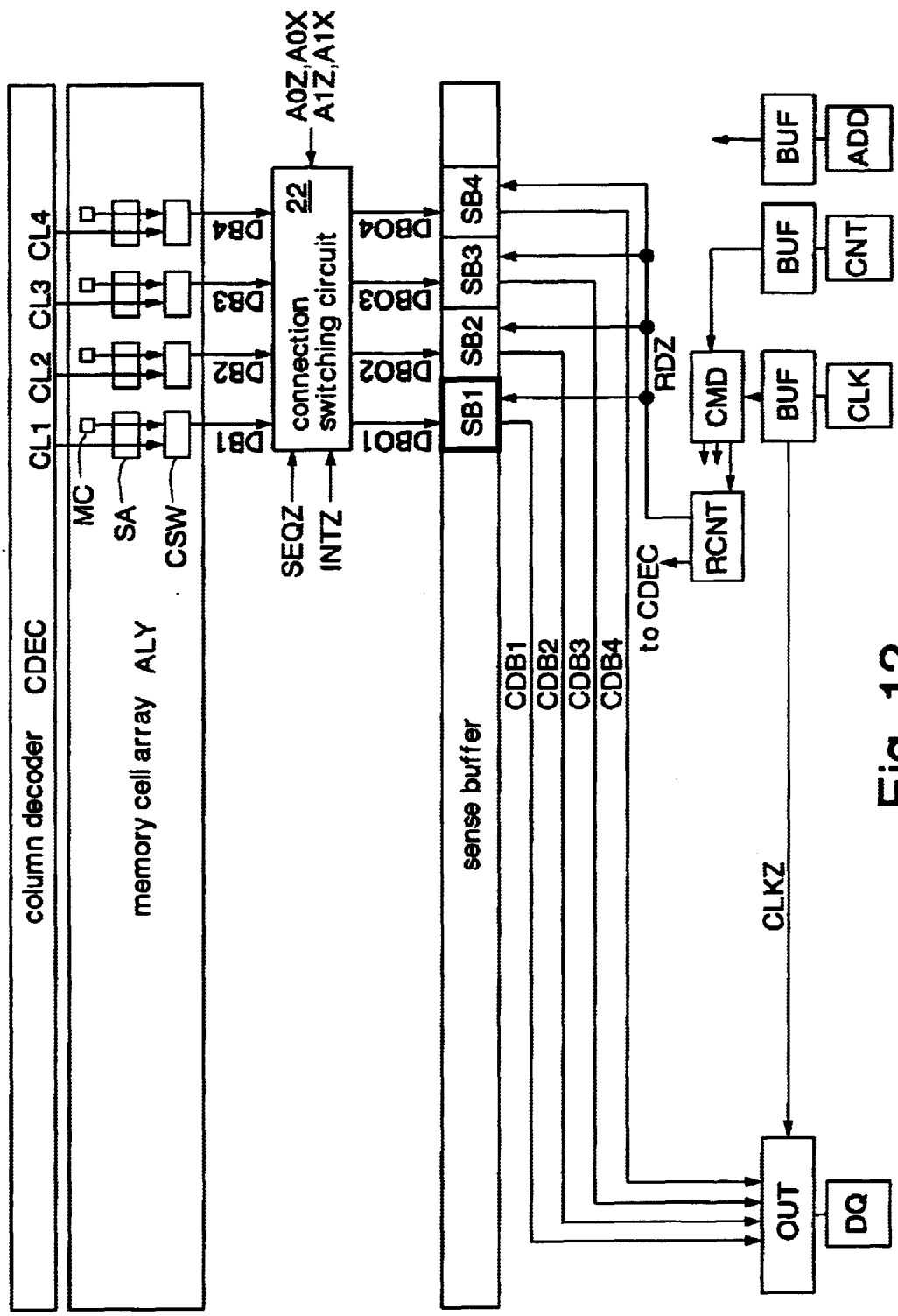
FIG. 12 is a block diagram showing a third embodiment.

FIG. 12 shows a third embodiment of the semiconductor memory according to the present invention. The same numerals and symbols are given to designate the same circuits and signals as those explained in the first embodiment, and detailed explanations thereof will be omitted.

According to this embodiment, a connection switching circuit 22 is arranged between column switches CSW and sense buffers SB1 to SB4. The connection switching circuit 22 is the circuit which operates according to addresses and data output modes, and changes an output order of read data which are successively outputted during burst read operation. In response to mode signals SEQZ and INTZ and address signals A0Z, A0X, A1Z and A1X, the connection switching circuit 22 connects respective local data bus lines DB1 to DB4 to any of data bus lines DBO1 to DBO4. It should be mentioned that the mode signals SEQZ and INTZ are the signals which are activated in later-described sequential mode and interleave mode, respectively. The address signals A0Z, A0X, A1Z and A1X are the signals which are generated from lower addresses supplied with a read command and are complementary to each other.

The data bus lines DBO1 to DBO4 are respectively connected to common data bus lines CDB1 to CDB4 through the sense buffers SB1 to SB4. The rest of the structure is the same as that of the first embodiment. Namely, the sense buffer SB1 indicated by a bold frame in the drawing and connected to the common data bus line CDB1 (first data bus line) has a faster operation speed and a higher drivability, as compared with the other sense buffers SB2 to SB4. Moreover, the common data bus line CDB1 has a larger wiring width as compared with the other common data bus lines CDB2 to CDB4 (second data bus lines), and its wiring resistance is low. A read control circuit RCNT activates a read control signal RDZ only during the first clock cycle, irrespective of a burst length, and the sense buffers SB1 to SB4 operate only during the first clock cycle. In the burst read operation, the four column switches CSW turn on in the first clock cycle of the read operation, and the read are transmitted respectively to the local data bus lines DB1 to DB4.

FIG. 13 shows a correspondence between the addresses supplied from the exterior and the output orders of the read data. This chart shows the case where the four read data are successively outputted in one read operation, that is, the case where the burst length is "4". The SDRAM of this embodiment has the sequential mode and the interleave mode, concerning an order of outputting the read data.

In the sequential mode, when the address signals A0 and A1 are "00", "01", "10" and "11", the read data read out to the local data bus lines DB1, DB2, DB3 and DB4 are outputted first, respectively. In the subsequent clock cycles, last numbers of the read local data bus lines DB are incremented so that a two-bit binary counter counts up.

In the interleave mode, when the address signals A0 and A1 are "00" and "10", the read data which are outputted first are the same as those of the sequential mode. Meanwhile, when the lower addresses A0 and A1 are "01" and "11", the read data of the local data bus lines DB1 and DB3 are switched to each other to be outputted. Thus, connection relationships between the local data bus lines DB1 to DB4 and the common data bus lines CDB1 to CDB4 are switched to one another, whereby the read data are outputted in the predetermined order.

It should be noted that, when the burst length, as a number of times of successively outputting the read data, is set to "1", that is, when normal read operation is performed instead of the burst read operation, the read control circuit RCNT activates only the sense buffer SB1 whose drivability is high, and the read data is outputted by using only the common data bus line CDB1 whose resistance is low (corresponding to a column "CDB1" which is first to the left in the drawing). Thus, it is possible to perform the normal read operation at a high speed as well.

Figure 14:
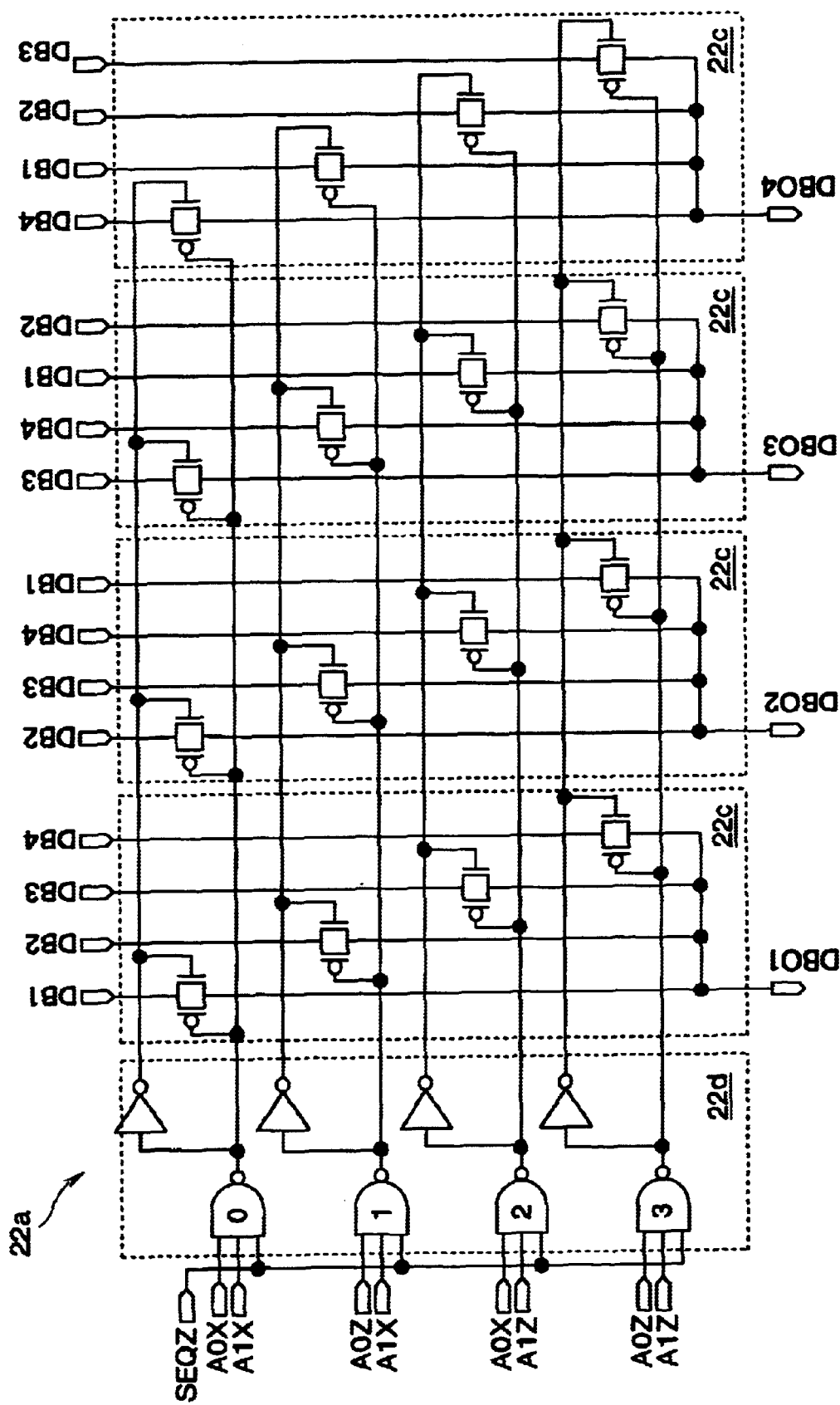
FIG. 14 is a circuit diagram showing the details of a connection switching circuit in FIG. 12.
Figure 15:
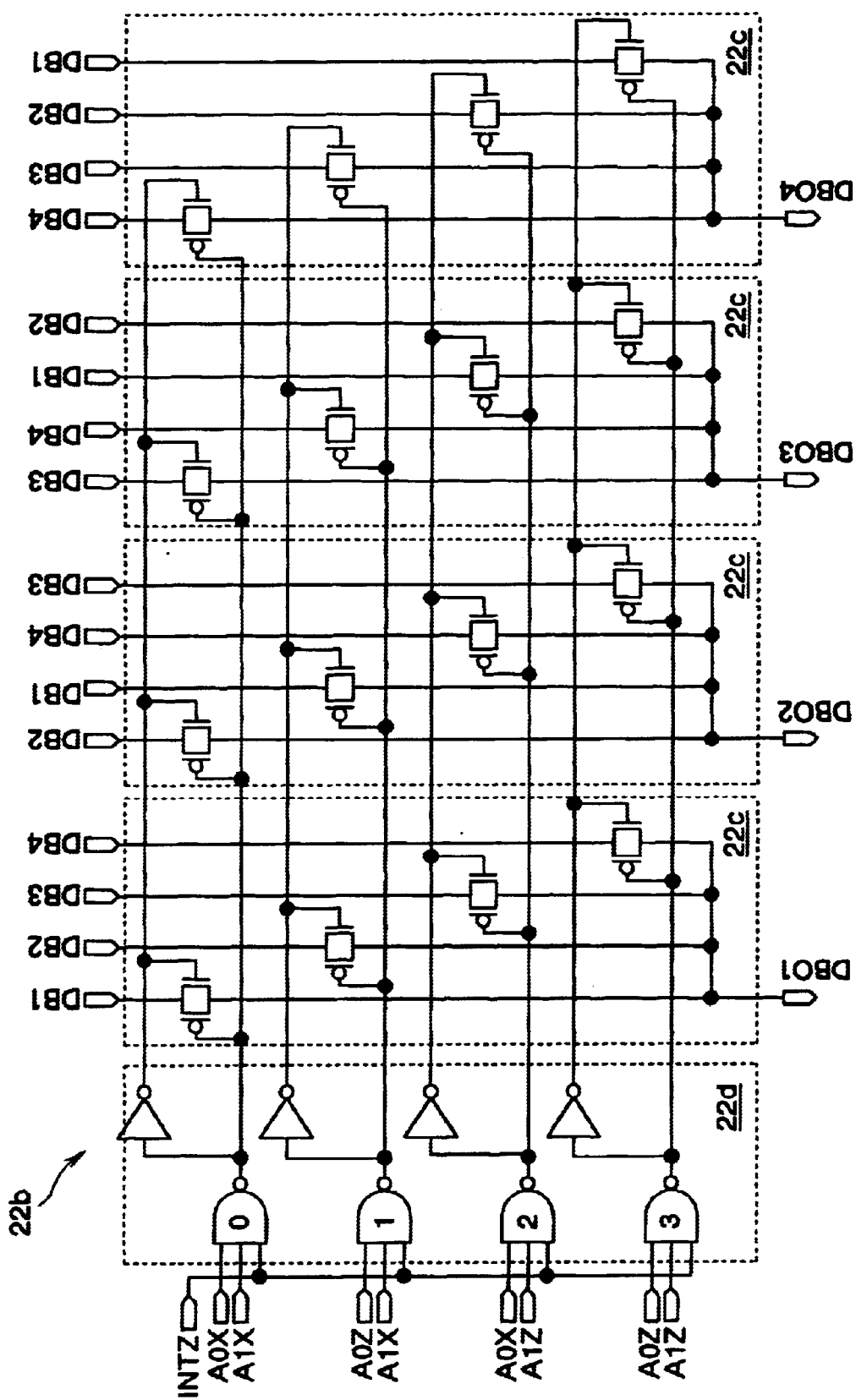
FIG. 15 is a circuit diagram showing the details of the connection switching circuit in FIG. 12.

FIG. 14 and FIG. 15 show the details of the connection switching circuit 22 for realizing the correspondence shown in FIG. 13. FIG. 14 shows a connection switching circuit 22a which corresponds to the sequential mode, and FIG. 15 shows a connection switching circuit 22b which corresponds to the interleave mode.

The connection switching circuit 22a in FIG. 14 includes four switching circuits 22c for connecting any of the local data bus lines DB1 to DB4 to the data bus line DBO1 (or DBO2 to DBO4), and a logic circuit 22d for controlling the switching circuits 22c. The logic circuit 22d includes four NAND gates which are activated by the mode signal SEQZ. The NAND gates decode the address signals A0Z, A0X, A1Z and A1X. A numeral written in each NAND gate indicates the address. When the address is supplied thereto, the NAND gate is activated and outputs the low level. In response to the activation of the NAND gate, any of CMOS transmission gates in the respective switching circuits 22c turn on to connect the local data bus lines DB and the data bus lines DBO. For example, when the address "00" is supplied thereto, the uppermost NAND gate in the drawing is activated and the local data bus lines DB1 to DB4 are respectively connected to the data bus lines DBO1 to DBO4. Then, as shown in FIG. 12, the data bus lines DBO1 to DBO4 are connected to the common data bus lines CDB1 to CDB4 through the sense buffers SB1 to SB4.

In the connection switching circuit 22b in FIG. 15, a logic circuit is activated by the mode signal INTZ indicating the interleave mode. Further, alignment of the local data bus lines DB1 to DB4 which are connected to respective switching circuits 22c is different from that of the above-described connection switching circuit 22a. The rest of the structure is the same as that of the connection switching circuit 22a. When, for example, the address "10" is supplied to the connection switching circuit 22b, the NAND gate third to the top in the drawing is activated, and the local data bus lines DB2, DB1, DB4 and DB3 are respectively connected to the data bus lines DBO1 to DBO4.

Figure 16:
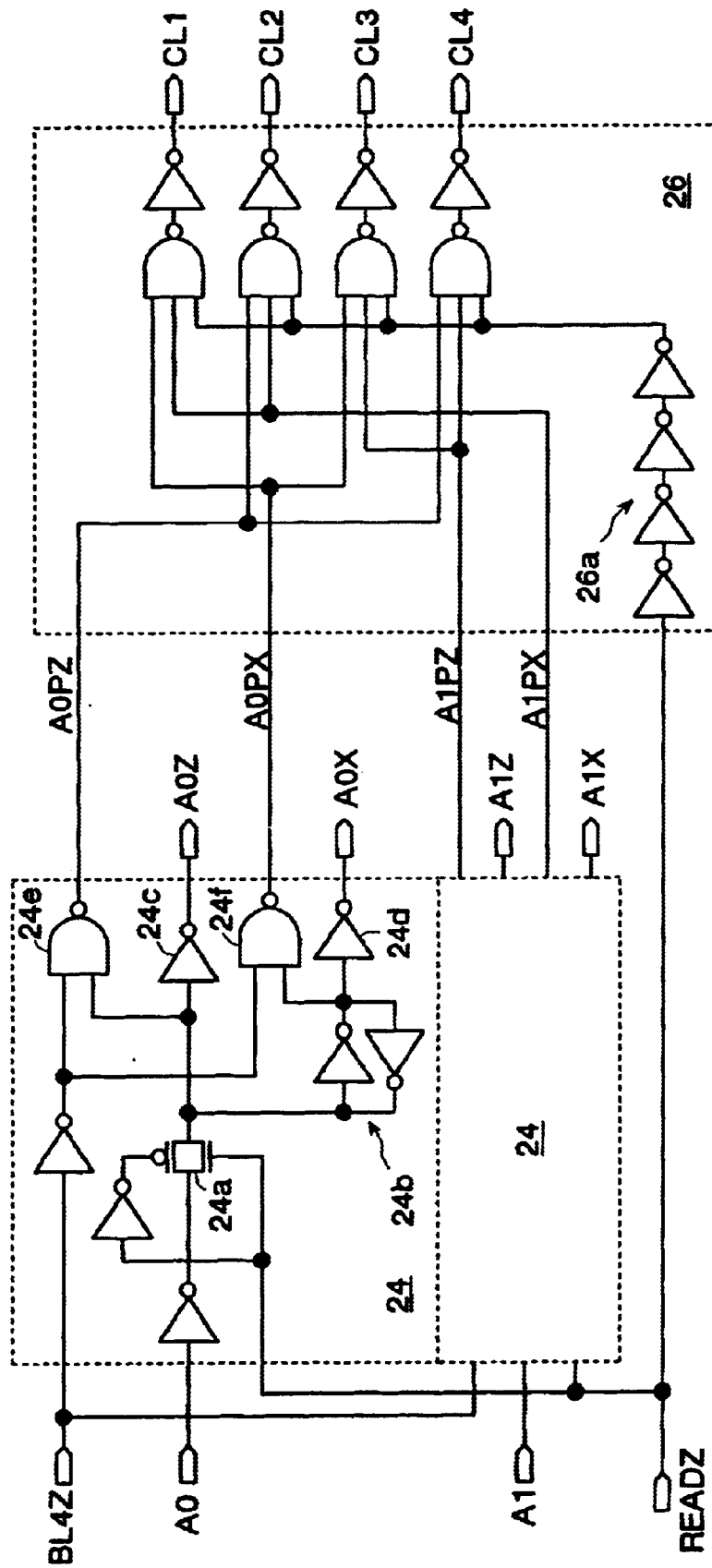
FIG. 16 is a circuit diagram showing the details of an address generator and a column generator of the third embodiment.

FIG. 16 shows two address generators 24 which generate the address signals A0Z and A0X and the address signals A1Z and A1X, and a column generator 26 which generates column line selecting signals CL1 to CL4. The column generator 26 is formed inside a column decoder CDEC in FIG. 12.

Each of the address generators 24 includes a CMOS transmission gate 24a, a latch 24b, inverters 24c and 24d, and NAND gates 24e and 24f. The CMOS transmission gate 24a transmits the address signal, which is received when a read control signal READZ is at the high level, to the interior. The latch 24b latches the address signal A0 (or A1) supplied from the CMOS transmission gate 24a. The inverters 24c and 24d output the latched address signal and an inverting signal of the address signal. The NAND gates 24e and 24f are activated except during the burst read mode, to output the latched address signal and an inverting signal of the address signal.

It should be mentioned that the read control signal READZ is the signal synchronizing with the read control signal RDZ in FIG. 12. The address generator 24 receives the address signal A0 to always output the address signals A0Z and A0X in synchronization with the read control signal READZ, and to output address signals A0PZ and A0PX in synchronization with the read control signal READZ except during the burst read operation. In other words, all of the address signals A0PZ and A0PX change to the high levels during the burst read operation, and the address signals A0PZ and A0PX change according to the address supplied from the exterior during the normal read operation for outputting the read data according to the address.

The column generator 26 includes a delay circuit 26a which delays the read control signal READZ and four AND circuits which decode the address signals A0PZ and A0PX when the read control signal READZ is activated and output these as the column line selecting signals CL1 to CL4. In the burst read mode, all of the address signals A0PZ and A0PX change to the high levels, and hence the column line selecting signals CL1 to CL4 are simultaneously activated in synchronization with the read control signal READZ. The column line selecting signals CL1 to CL4 are activated after the local data bus lines DB1 to DB4 and the data bus lines DBO1 to DBO4 are connected by the delay circuit 26a. Namely, the data bus lines DB and DBO are connected in advance so that the read data can be transmitted to the sense buffers SB1 to SB4 at a high speed.

The same effects as those of the above-described first embodiment can be obtained in this embodiment as well. Further, in this embodiment, the connection switching circuit 22 allows the read data which is first outputted in the burst read operation to be amplified by the sense buffer SB1 whose drivability is high, at all times. Therefore, it is possible to shorten the read operation time and to reduce the power consumption, even in the SDRAM which can switch the output orders of the read data according to the addresses or the operation modes (the sequential mode or the interleave mode).

When the burst length is set to "1", the sense buffer SB1 whose drivability is high is operated to output the read data. Hence, the normal read operation can be performed at a high speed as well.

Figure 17:
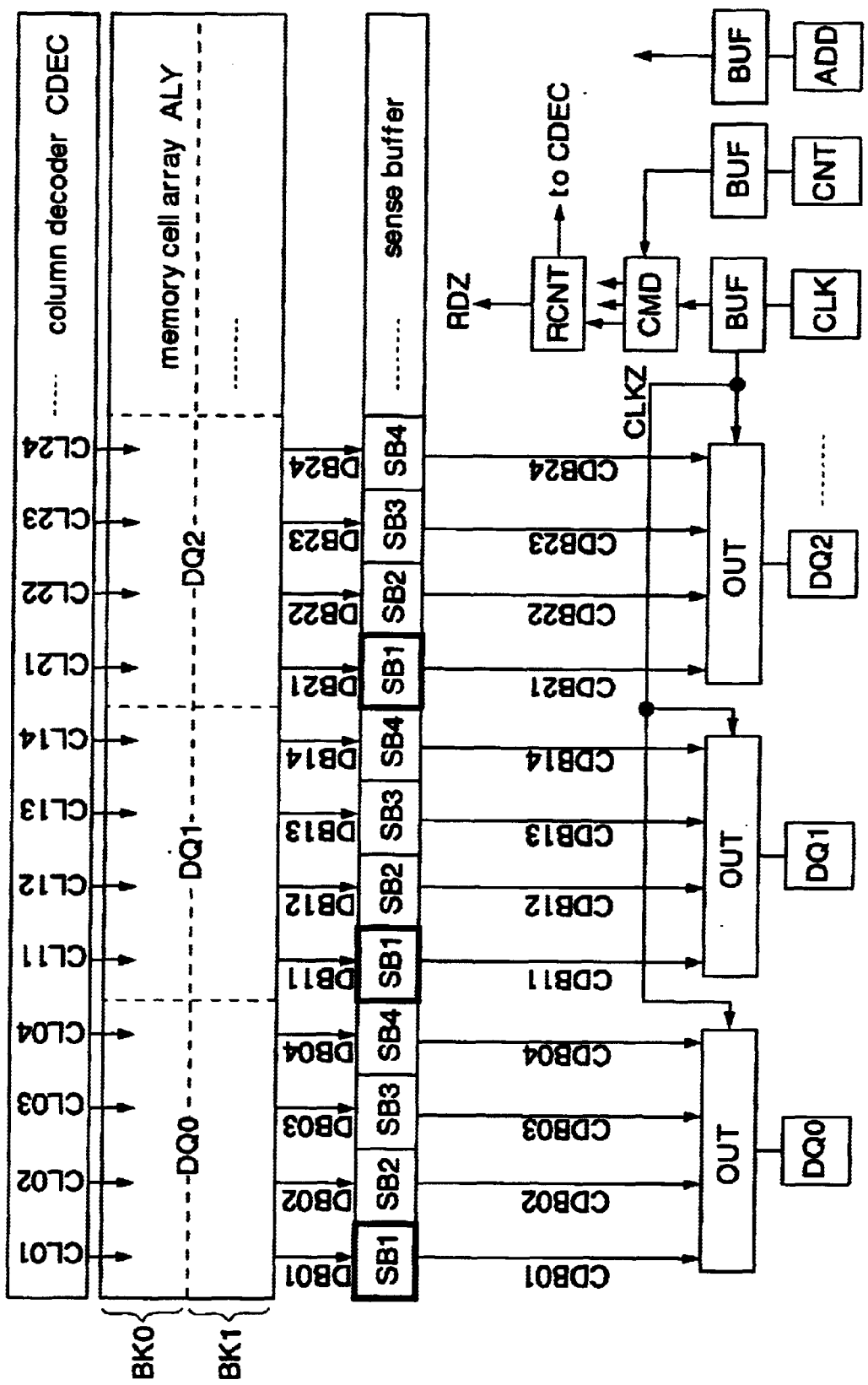
FIG. 17 is a block diagram showing a fourth embodiment.

FIG. 17 shows a fourth embodiment of the semiconductor memory according to the present invention. The same numerals and symbols are given to designate the same circuits and signals as those explained in the first and third embodiments, and detailed explanations thereof will be omitted.

According to this embodiment, a memory cell array ALY is divided corresponding to respective data terminals DQ. Further, circuits and signal lines which are the same as those of the first embodiment are formed for each division, in order to output read data to the exterior. The circuits, signal lines, divided memory cell array ALY as above comprise a plurality of blocks. The blocks are arranged in a disposing direction of the data terminals DQ (first direction).

For example, in the block corresponding to a data terminal DQ0, four sense buffers SB1 to SB4, four local data bus lines DB01 to DB04, four common data bus lines CDB01 to CDB04 and a data output circuit OUT are formed, and column line selecting signals CL01 to CL04 are supplied to a memory area. Numerals second to the last of the signal lines and signals indicate the numbers of the data terminals DQ. Similarly to the first embodiment, the sense buffer SB1 as indicated by a bold frame is designed to have a higher drivability than those of the other sense buffers SB2 to SB4.

The common data bus lines CDB01 to CDB04 are wired in a second direction which is orthogonal to the first direction. Since the direction of transmission paths of the read data and the wiring direction of the common data bus lines CDB01 to CDB04 are the same, it is possible to wire the common data bus lines CDB01 to CDB04 with efficiency and to shorten these wiring lengths. Further, since the blocks are arranged in the disposing direction of the data terminals DQ, it is possible to arrange the blocks which correspond to the respective data terminals DQ near the data terminals DQ, respectively, and to further shorten the wiring lengths of the common data bus lines.

Each section of the memory cell array ALY is divided into two memory areas in a vertical direction of the drawing. Further, the memory areas which are aligned in a horizontal direction of the drawing form banks BK0 and BK1. The respective banks BK0 and BK1 can be operated independently.

Since the memory cells corresponding to each DQ are collected to one area to form the memory area, and further, the banks BK0 and BK1 are structured in the vertical direction in the drawing, it is possible to transmit the read data which are read from both of the banks BK0 and BK1 easily to the common data bus lines CDB which are wired in the vertical direction in the drawing. As a result of this, it is possible to minimize the wiring lengths of the common data bus lines CDB and to reduce a wiring resistance and a wiring capacitance. Therefore, the drivabilities of the sense buffers SB1 to SB4 for driving the common data bus lines CDB can be reduced and the power consumption during the read operation can be reduced. When the drivabilities of the sense buffers SB1 to SB4 are made to be the same as those of the first embodiment, it is possible to shorten the read operation time.

The same effects as those of the above-described first embodiment can be obtained in this embodiment as well. Further, according to this embodiment, the blocks are formed corresponding to the respective data terminals DQ. Hence, it is possible to shorten the read operation time and to reduce the power consumption, even in the SDRAM having the plurality of data terminals, that is, a multi-bit SDRAM.

The blocks corresponding to the respective data terminals DQ are arranged in the disposing direction of the data terminals DQ (first direction), and the common data bus lines CDB are wired in the second direction which is orthogonal to the first direction. Hence, it is possible to minimize the wiring lengths of the data bus lines, and to minimize the wiring resistances and wiring capacitances of the data bus lines. As a result of this, it is possible to shorten the read operation time and to reduce the power consumption further.

The memory cell array ALY in the respective blocks is divided into the plurality of memory areas in the second direction, and the plurality of banks BK0 and BK1 are formed from the memory areas aligned in the first direction, each of which can be operated independently. Hence, it is possible to transmit the read data read from the memory cells by using only the wires in the second direction. As a result of this, it is possible to minimize the lengths of the signal lines such as the data bus lines for transmitting the read data, and to shorten the read operation time further.

Figure 18:
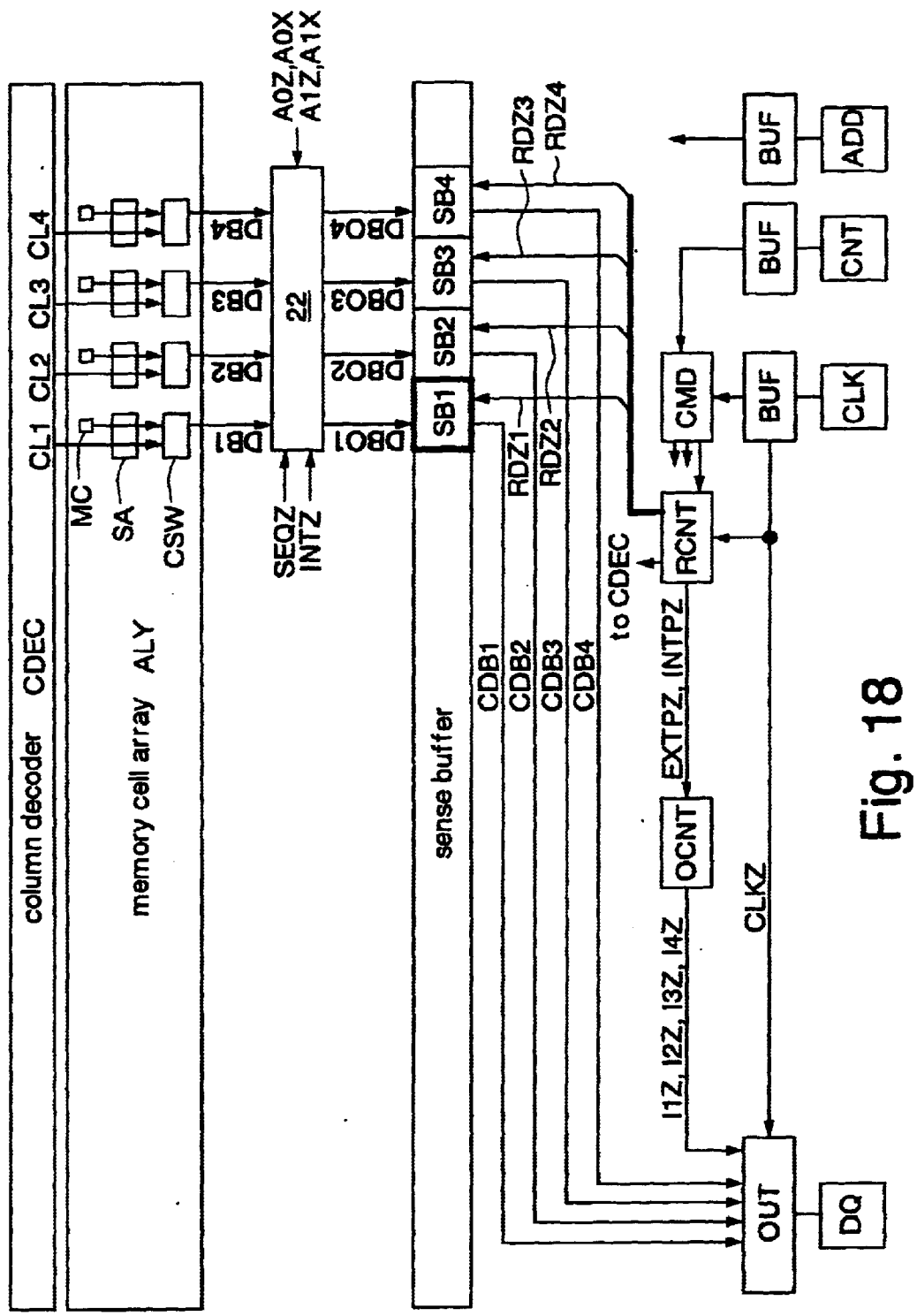
FIG. 18 is a block diagram showing a fifth embodiment.

FIG. 18 shows a fifth embodiment of the semiconductor memory according to the present invention. The same numerals and symbols are given to designate the same circuits and signals as those explained in the above-described embodiments, and detailed explanations thereof will be omitted.

According to this embodiment, a read control circuit RCNT outputs read control signals RDZ1 to RDZ4 which correspond to sense buffers SB1 to SB4, respectively. Activation timings of the read control signals RDZ1 to RDZ4 are sequentially shifted from one another, similarly to the above-described second embodiment (FIG. 11). The rest of the structure is the same as that of the third embodiment.

The same effects as those of the above-described first to third embodiments can be obtained in this embodiment as well.

Figure 19:
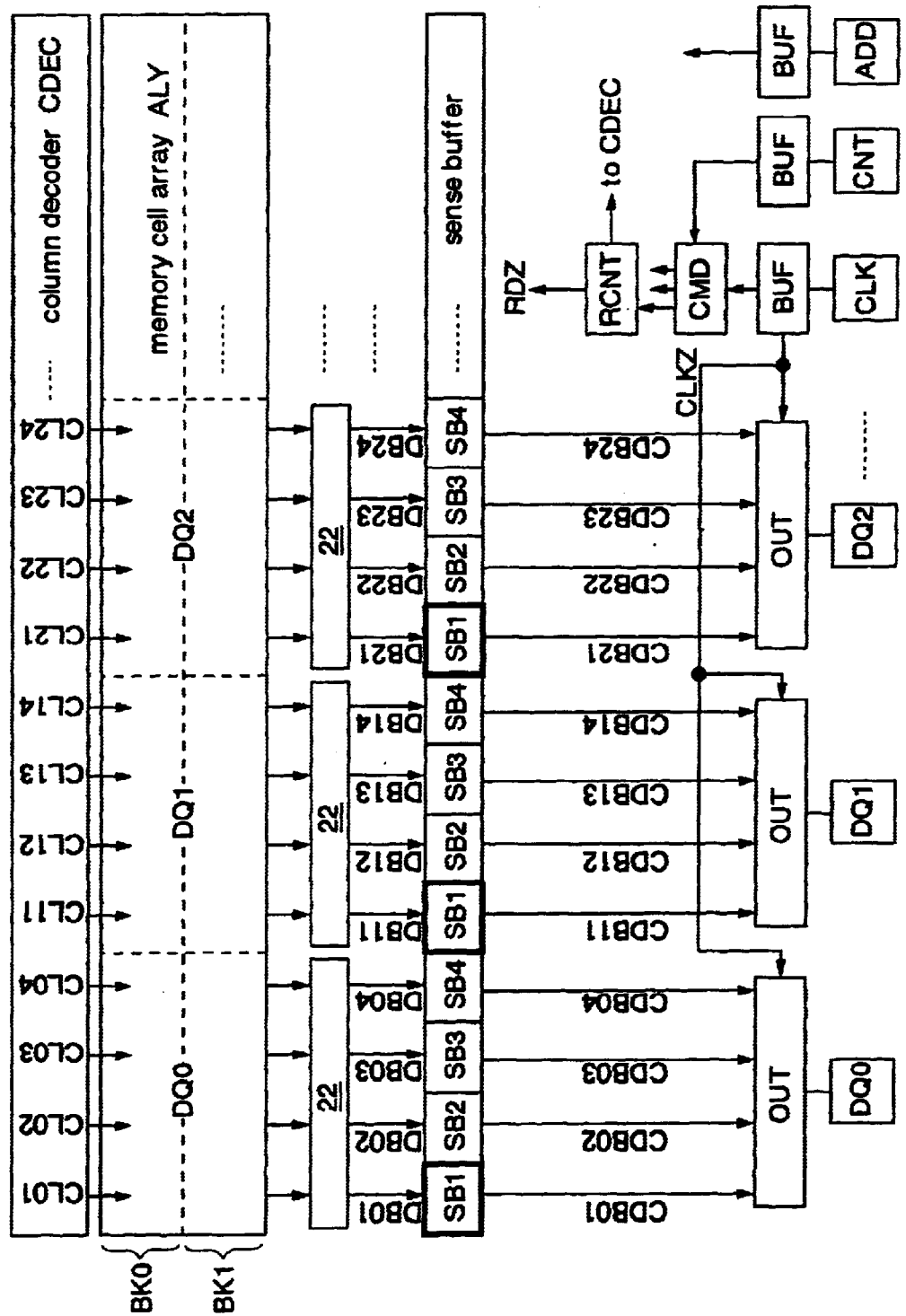
FIG. 19 is a block diagram showing a sixth embodiment.

FIG. 19 shows a sixth embodiment of the semiconductor memory according to the present invention. The same numerals and symbols are given to designate the same circuits and signals as those explained in the above-described embodiments, and detailed explanations thereof will be omitted According to this embodiment, the connection switching circuit 22 of the third embodiment (FIG. 12) is arranged between the memory cell arrays. ALY of the fourth embodiment (FIG. 17), which are divided corresponding to the data terminals DQ, and sense buffers SB1 to SB4. The rest of the structure is the same as that of the fourth embodiment.

The same effects as those of the above-described first, third and fourth embodiments can be obtained in this embodiment as well.

Figure 20:
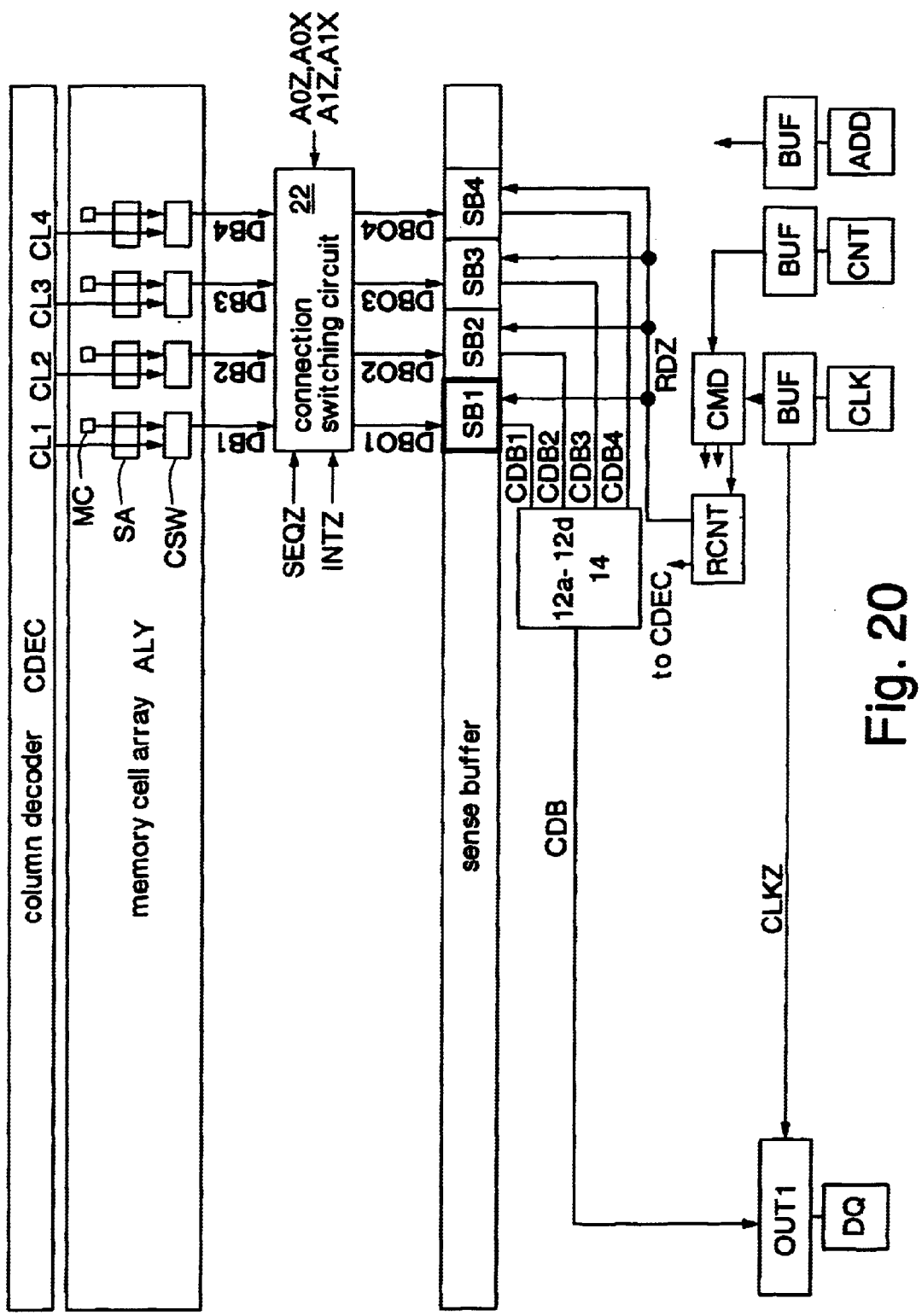
FIG. 20 is a block diagram showing a seventh embodiment.

FIG. 20 shows a seventh embodiment of the semiconductor memory according to the present invention. The same numerals and symbols are given to designate the same circuits and signals as those explained in the above-described embodiments, and detailed explanations thereof will be omitted.

According to this embodiment, a part of the data output circuit OUT of the first embodiment (FIG. 8) is arranged at a position close to sense buffers SB1 to SB4. Namely, the switching circuits 12a, 12b, 12c and 12d (second switching circuit) and the NAND gate 14 of FIG. 8 are arranged near the sense buffers SB1 to SB4. A data output circuit OUT1 is structured by the output latching circuits 16 and 18 and the tri-state output buffer 20. The rest of the structure is the same as that of the fourth embodiment.

According to this embodiment, one common data bus line CDB is wired from the sense buffers SB1 to SB4 (to be exact, from the NAND gate 14) to the data output circuit OUT1, whereby read data amplified in the sense buffers SB1 to SB4 can be transmitted to the data output circuit OUT1.

The same effects as those of the above-described third embodiment can be obtained in this embodiment as well. Further, since a number of the common data bus lines CDB can be reduced, it is possible to reduce a chip size. Moreover, since the lengths of the common data bus lines CDB1 to CDB4 which are driven by the sense buffers SB1 to SB4 can be shortened, it is possible to reduce drivability of the sense buffers SB1 to SB4. As a result of this, it is possible to reduce power consumption.

Incidentally, in the above-described first embodiment (FIG. 3), the example of transmitting the read data which are outputted from the sense buffers SB1 to SB4 to the data output circuit GUT through the common data bus lines CDB1 to CDB4, respectively, and converting the data from parallel to serial in the switching circuits 12a to 12d in the data output circuit OUT is explained. The present invention is not limited to the above embodiment. For example, the switching circuits 12a to 12d and the NAND gate 14 which are shown in FIG. 8 may be arranged close to the sense buffers SB1 to SB4, and the read data which are converted from parallel to serial may be outputted to the data output circuit OUT through one common data bus line. In this case, similarly to the first embodiment, it is possible to reduce the power consumption during the burst read operation. Further, since the number of the common data bus lines can be reduced, it is possible to reduce the chip size.

In the above-described embodiments, the example of making the wiring width of the common data bus line CDB1 larger than the wiring widths of the other common data bus lines CDB2 to CDB4 to reduce the wiring resistance is explained. The present invention is not limited to the above embodiments. For example, the wiring resistance and wiring capacitance may be reduced by differentiating material of the wires of the common data bus line CDB1 and the other common data bus lines CDB2 to CDB4. The wiring resistance and wiring capacitance may also be reduced by differentiating wiring layers of the common data bus line CDB1 and the other common data bus lines CDB2 to CDB4. In this case, the common data bus line CDB1 may be formed by metal wiring, and the common data bus lines CDB2 to CDB4 may be formed by polysilicon wiring.

The invention is not limited to the above embodiments and various modifications may be made without departing from the spirit and the scope of the invention. Any improvement may be made in part or all of the components.

What is claimed is:

1. A semiconductor memory comprising:
    a plurality of memory cells;
    a plurality of sense amplifiers for amplifying parallel read data from said memory cells, respectively;
    a plurality of read amplifiers for amplifying said read data amplified in said sense amplifiers up to respective predetermined logic levels, in which at least one of the read amplifiers has a higher drivability than drivabilities of the rest of the read amplifiers;
    a connection switching circuit for connecting said sense amplifiers to a predetermined one of said read amplifiers, according to an address;
    a data output circuit for outputting said read data amplified in said read amplifiers in order, starting from read data corresponding to said read amplifier having a higher drivability, during burst read operation in which said read data are successively outputted to the exterior of the memory; and
    a plurality of data bus lines for connecting said read amplifiers and said data output circuit, respectively.

2. The semiconductor memory according to claim 1, wherein
    one of said read amplifiers has a higher drivability than drivabilities of the rest of said read amplifiers.

3. The semiconductor memory according to claim 1, wherein
    the drivabilities of said read amplifiers are set according to sizes of transistors constituting said read amplifiers.

4. The semiconductor memory according to claim 1, wherein
    said data output circuit comprises a parallel/serial conversion circuit for outputting said parallel read data outputted from said read amplifiers as serial data.

5. The semiconductor memory according to claim 1, further comprising:
    a plurality of column switches for turning on in the first clock cycle of said burst read operation, connecting said sense amplifiers and said read amplifiers respectively, and transmitting said read data to said read amplifiers simultaneously.

6. The semiconductor memory according to claim 1, wherein
    said data bus lines have first data bus line(s) connected to said read amplifier(s) having a higher drivability and second data bus lines connected to the rest of said read amplifiers, and impedance(s) of said first data bus line(s) is/are lower than impedances of said second data bus lines.

7. The semiconductor memory according to claim 6, wherein
    wiring width(s) of said first data bus line(s) is/are larger than wiring widths of said second data bus lines.

8. The semiconductor memory according to claim 6, wherein
    wiring resistance(s) of said first data bus line(s) is/are lower than wiring resistances of said second data bus lines.

9. The semiconductor memory according to claim 8, further comprising
    a plurality of wiring layers formed above a semiconductor substrate, and wherein
    said first data bus line(s) is/are formed on the wiring layer(s) different from the wiring layers on which said second data bus lines are formed.

10. The semiconductor memory according to claim 1, further comprising
  a read control circuit for outputting a read control signal corresponding to said read amplifier(s) having higher drivability(s) before read control signals corresponding to the rest of said read amplifiers, and wherein
  said read amplifiers are activated according to said read control signals, respectively.

11. The semiconductor memory according to claim 1, wherein:
  the semiconductor memory has a plurality of data output modes in which said read data are output in different orders from one another; and
  said connection switching circuit includes switching circuits for connecting said sense amplifiers to predetermined ones of said read amplifiers respectively, according to said address and said data output modes.

12. The semiconductor memory according to claim 1, further comprising:
  a read control circuit for operating only said read amplifier(s) having higher drivability(s) to output data, when a burst length, as a number of times of successively outputting said read data, is set to a singular number.

13. The semiconductor memory according to claim 1, further comprising:
  a plurality of blocks having said memory cells, said sense amplifiers, said read amplifiers, said data output circuit, and said data bus lines, and corresponding to respective data terminals.

14. The semiconductor memory according to claim 13, wherein:
  said blocks are arranged in a first direction; and
  said data bus lines are wired in a second direction orthogonal to said first direction.

15. The semiconductor memory according to claim 14, wherein
  said first direction is a disposing direction of said data terminals.

16. The semiconductor memory according to claim 14, wherein
  each of said blocks is divided into a plurality of memory areas in said second direction, and a plurality of said memory areas aligned in said first direction form banks which operate independently.

17. A semiconductor memory comprising:
  a plurality of memory cells;
  a plurality of sense amplifiers for amplifying parallel read data from said memory cells, respectively;
  a plurality of read amplifiers for amplifying said read data amplified in said sense amplifiers up to respective predetermined logic levels, in which at least one of the read amplifiers has a higher drivability than drivabilities of the rest of the read amplifiers;
  a connection switching circuit for connecting said sense amplifiers to predetermined ones of said read amplifiers, according to an address;
  a switching circuit being arranged close to said read amplifiers, for outputting said parallel read data amplified in said read amplifiers in sequential order, starting from said read data corresponding to said read amplifier(s) having higher drivability(s), during burst read operation in which said read data are successively outputted;
  a data output circuit for outputting said read data outputted from said switching circuit; and
  a data bus line for connecting said switching circuit and said data output circuit.

* * * * *